(12) United States Patent
Kim et al.

(10) Patent No.: US 12,532,519 B2
(45) Date of Patent: Jan. 20, 2026

(54) SEMICONDUCTOR DEVICE

(71) Applicant: SAMSUNG ELECTRONICS CO., LTD., Suwon-si (KR)

(72) Inventors: Ho-Jun Kim, Suwon-si (KR); Jun Beom Park, Suwon-si (KR); Kwan Young Chun, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 660 days.

(21) Appl. No.: 17/894,269

(22) Filed: Aug. 24, 2022

(65) Prior Publication Data
US 2023/0282703 A1 Sep. 7, 2023

(30) Foreign Application Priority Data
Mar. 7, 2022 (KR) .................. 10-2022-0028554

(51) Int. Cl.
*H10D 62/10* (2025.01)
*H10D 30/43* (2025.01)
*H10D 30/67* (2025.01)

(52) U.S. Cl.
CPC .......... *H10D 62/121* (2025.01); *H10D 30/43* (2025.01); *H10D 30/6729* (2025.01); *H10D 30/6757* (2025.01)

(58) Field of Classification Search
CPC .. H10D 62/121; H10D 30/43; H10D 30/6729; H10D 30/6757; H10D 30/6735; H10D 64/017; H10D 64/256; H10D 62/151; H10D 84/85; H10D 84/83; H10D 88/00; H10D 84/0186; H10D 84/0149; H10D 84/038; H10D 64/512; H10D 84/834; H10D 84/856; H10D 30/62; H10D 84/853; B82Y 10/00
See application file for complete search history.

(56) References Cited

U.S. PATENT DOCUMENTS

| | | | |
|---|---|---|---|
| 9,136,153 | B2 | 9/2015 | Or-Bach et al. |
| 9,397,101 | B2 | 7/2016 | Chintarlapalli Reddy et al. |
| 10,297,513 | B1 | 5/2019 | Yamashita et al. |
| 10,381,346 | B1 | 8/2019 | Zhang et al. |
| 10,529,625 | B2 | 1/2020 | Anderson et al. |
| 10,658,481 | B1 | 5/2020 | Zhang et al. |
| 2005/0151276 | A1* | 7/2005 | Jang ............ H10B 10/125 257/427 |
| 2020/0066683 | A1* | 2/2020 | Kim ............ H01L 23/481 |
| 2020/0411433 | A1 | 12/2020 | Lilak et al. |
| 2021/0280578 | A1 | 9/2021 | Wu et al. |

* cited by examiner

*Primary Examiner* — Jonathan Han
(74) *Attorney, Agent, or Firm* — Sughrue Mion, PLLC

(57) ABSTRACT

A semiconductor device is provided. The semiconductor device includes a lower substrate; a lower active pattern which extends in a first direction on the lower substrate; a first lower gate electrode which extends in a second direction on the lower active pattern; an upper substrate on the first lower gate electrode; an upper active pattern which extends in the first direction on the upper substrate, wherein the upper active pattern is spaced apart from the lower active pattern in each of the second direction and a vertical direction; a first upper gate electrode which extends in the second horizontal direction on the upper active pattern, wherein the first upper gate electrode at least partially overlaps the first lower gate electrode in the vertical direction; and a first gate contact which is spaced apart from the first upper gate electrode in the second horizontal direction.

20 Claims, 34 Drawing Sheets

SEMICONDUCTOR DEVICE

CROSS-REFERENCE TO RELATED APPLICATION

This application claims priority from Korean Patent Application No. 10-2022-0028554, filed on Mar. 7, 2022 in the Korean Intellectual Property Office, the disclosure of which is incorporated by reference herein in its entirety.

BACKGROUND

1. Technical Field

The present disclosure relates to a semiconductor device, and more specifically, to a semiconductor device including a Multi-Bridge Channel Field Effect Transistor (MBCFET™).

2. Description of Related Art

In recent years, with rapid supply of information media, functionality of semiconductor devices has been dramatically increased. In the case of recent semiconductor products, there is a need to high integration, and semiconductor devices are being scaled down to increase integration.

As a pitch size decreases, a decrease in capacitance and electrical stability between contacts inside the semiconductor device need to be provided.

SUMMARY

One or more embodiments provide a semiconductor device in which an upper semiconductor element including an upper gate electrode is stacked on a lower semiconductor element including a lower gate electrode to improve the degree of integration.

According to an aspect of an example embodiment, a semiconductor device includes: a lower substrate; a lower active pattern which extends in a first horizontal direction on the lower substrate; a first lower gate electrode which extends in a second horizontal direction which crosses the first horizontal direction on the lower active pattern; a junction on the first lower gate electrode; an upper substrate on the junction; an upper active pattern which extends in the first horizontal direction on the upper substrate, wherein the upper active pattern is spaced apart from the lower active pattern in each of the second horizontal direction and a vertical direction which crosses the first horizontal direction and the second horizontal direction; a first upper gate electrode which extends in the second horizontal direction on the upper active pattern, wherein the first upper gate electrode at least partially overlaps the first lower gate electrode in the vertical direction; and a first gate contact which is spaced apart from the first upper gate electrode in the second horizontal direction, wherein the first gate contact extends through the upper substrate and the junction in the vertical direction, the first gate contact is connected to the first lower gate electrode, and the first gate contact has an upper surface that is farther from the lower substrate than an upper surface of the first upper gate electrode.

According to an aspect of an example embodiment, a semiconductor device includes: a lower substrate; a lower active pattern which extends in a first horizontal direction on the lower substrate; a first lower gate electrode which extends in a second horizontal direction which crosses the first horizontal direction on the lower active pattern; a lower source/drain region on at least one side of the first lower gate electrode; a lower interlayer insulating layer on side walls of the first lower gate electrode; a junction on the lower interlayer insulating layer and the first lower gate electrode; an upper substrate on the junction; an upper active pattern which extends in the first horizontal direction on the upper substrate; a first upper gate electrode which extends in the second horizontal direction on the upper active pattern, wherein the first upper gate electrode at least partially overlaps the first lower gate electrode in a vertical direction which crosses the first horizontal direction and the second horizontal direction; an upper source/drain region on at least one side of the first upper gate electrode; an upper interlayer insulating layer on side walls of the first upper gate electrode; a first source/drain contact which extends through the upper interlayer insulating layer, the upper substrate, the junction and the lower interlayer insulating layer in the vertical direction, and is connected to the lower source/drain region; and a second source/drain contact which extends through the upper interlayer insulating layer in the vertical direction, and is connected to the upper source/drain region. An upper surface of the first source/drain contact and an upper surface of the second source/drain contact extend along a common plane.

According to an aspect of an example embodiment, a semiconductor device includes: a lower substrate; a lower active pattern which extends in a first horizontal direction on the lower substrate; a first lower gate electrode which extends in a second horizontal direction which crosses the first horizontal direction on the lower active pattern; a second lower gate electrode which extends in the second horizontal direction on the lower active pattern, wherein the second lower gate electrode is spaced apart from the first lower gate electrode in the first horizontal direction; a lower source/drain region between the first lower gate electrode and the second lower gate electrode; a lower interlayer insulating layer on side walls of each of the first and second lower gate electrodes; a junction on the lower interlayer insulating layer and the first and second lower gate electrodes; an upper substrate on the junction; an upper active pattern which extends in the first horizontal direction on the upper substrate; a first upper gate electrode which extends in the second horizontal direction on the upper active pattern, wherein the first upper gate electrode at least partially overlaps the first lower gate electrode in a vertical direction which crosses the first horizontal direction and the second horizontal direction; a second upper gate electrode which extends in the second horizontal direction on the upper active pattern, wherein the second upper gate electrode is spaced apart from the first upper gate electrode in the first horizontal direction, and the second upper gate electrode at least partially overlaps the second lower gate electrode in the vertical direction; an upper source/drain region between the first upper gate electrode and the second upper gate electrode; an upper interlayer insulating layer on side walls of the first and second upper gate electrodes; a first gate contact which is spaced apart from the first upper gate electrode in the second horizontal direction, wherein the first gate contact extends through the upper interlayer insulating layer, the upper substrate and the junction in the vertical direction, the first gate contact is connected to the first lower gate electrode, and the first gate contact has an upper surface that is farther from the lower substrate than an upper surface of the first upper gate electrode; a second gate contact which is spaced apart from the second upper gate electrode in the second horizontal direction, the second gate contact extends through the upper interlayer insulating layer, the upper substrate and the junction in the vertical direction, the second gate contact is connected to the second lower gate electrode, the second gate contact has an upper surface that is farther from the lower substrate than an upper surface of the second upper gate electrode; a third gate contact which is in contact with the second gate contact, wherein the third gate contact is connected to the second upper gate electrode, and an upper surface of the third gate contact and the upper surface of the second gate contact extend along a common plane; a first source/drain contact which extends through the upper interlayer insulating layer, the upper substrate, the junction and the lower interlayer insulating layer in the vertical direction, and is connected to the lower source/drain region; and a second source/drain contact which extends through the upper interlayer insulating layer in the vertical direction, and is connected to the upper source/drain region. An upper surface of the first source/drain contact and an upper surface of the second source/drain contact extend along the common plane.

The present disclosure is not restricted to the specific embodiments

BRIEF DESCRIPTION OF DRAWINGS

The above and other aspects and features will be more apparent from the following description of example embodiments with reference to the attached drawings, in which.

DETAILED DESCRIPTION

Figure 1:
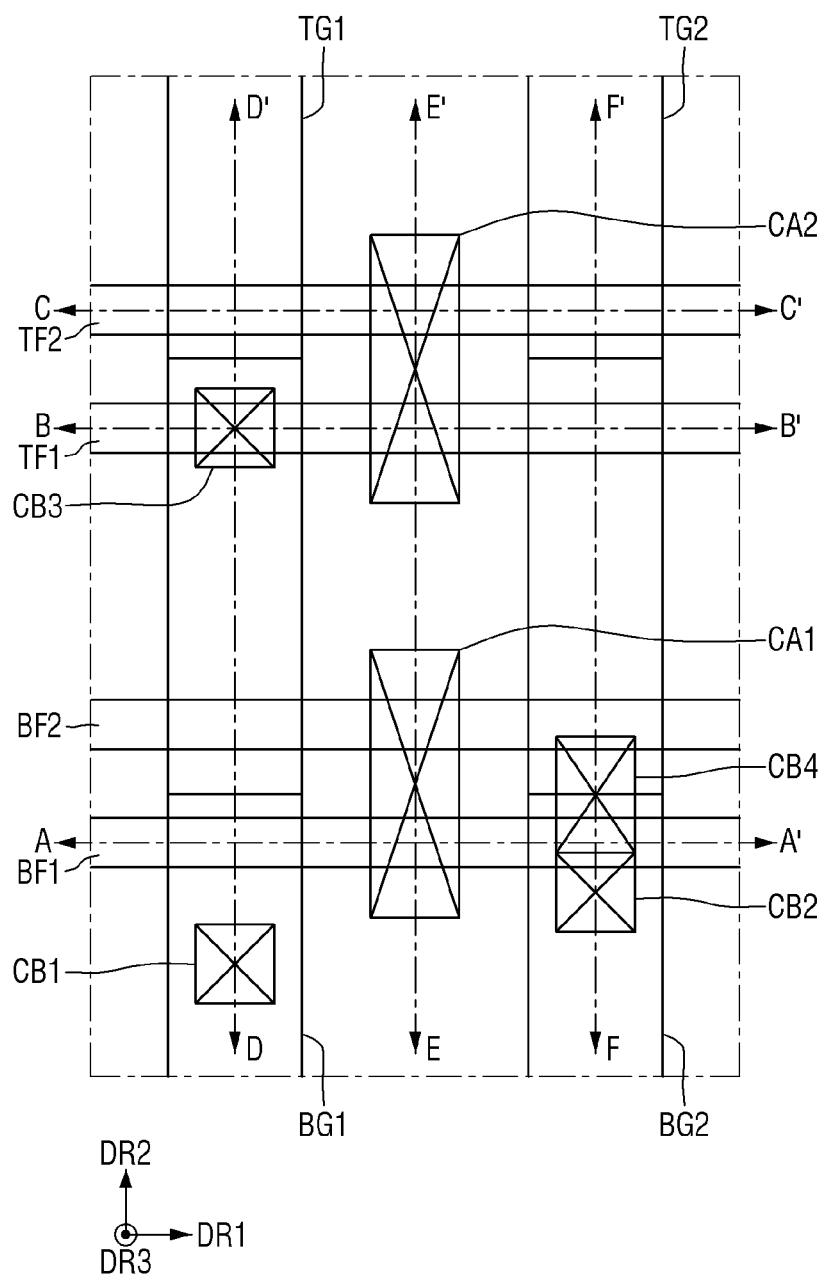
FIG. 1 is a layout diagram for explaining a semiconductor device according to some embodiments.

Embodiments will now be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. In the drawings relating to the semiconductor device according to some embodiments, although an example which includes a Multi-Bridge Channel Field Effect Transistor (MBCFET™) including nanosheets and a fin-shaped transistor (FinFET) including a channel region of a fin-shaped pattern shape will be described as an example, embodiments are not limited thereto.

Hereinafter, a semiconductor device according to some embodiments will be described referring to FIGS. 1 to 7.

Figure 2:
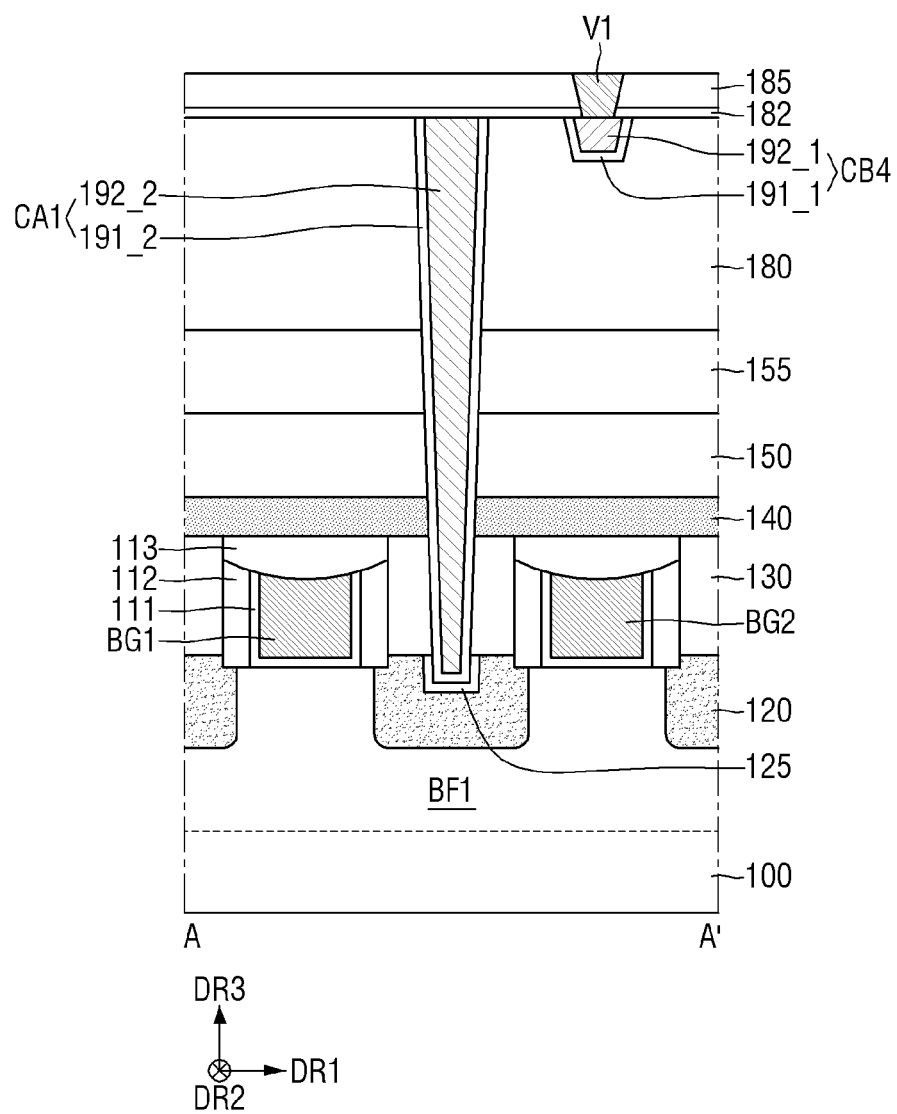
FIG. 2 is a cross-sectional view taken along a line A-A' of FIG. 1.
Figure 3:
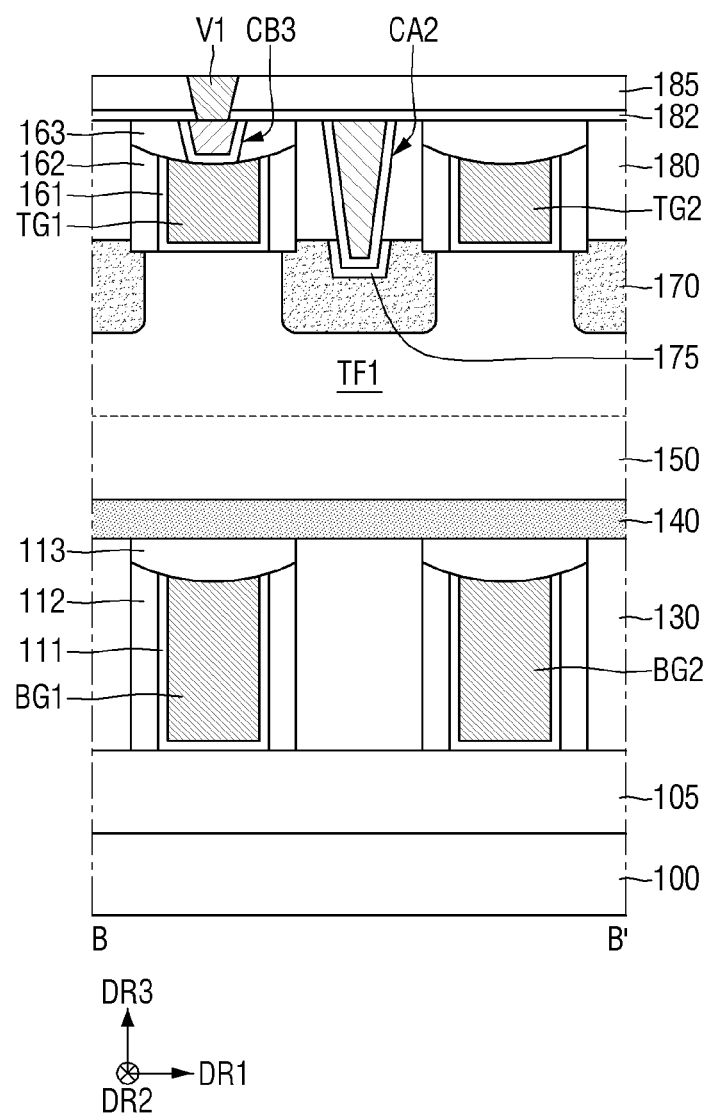
FIG. 3 is a cross-sectional view taken along a line B-B' of FIG. 1.
Figure 4:
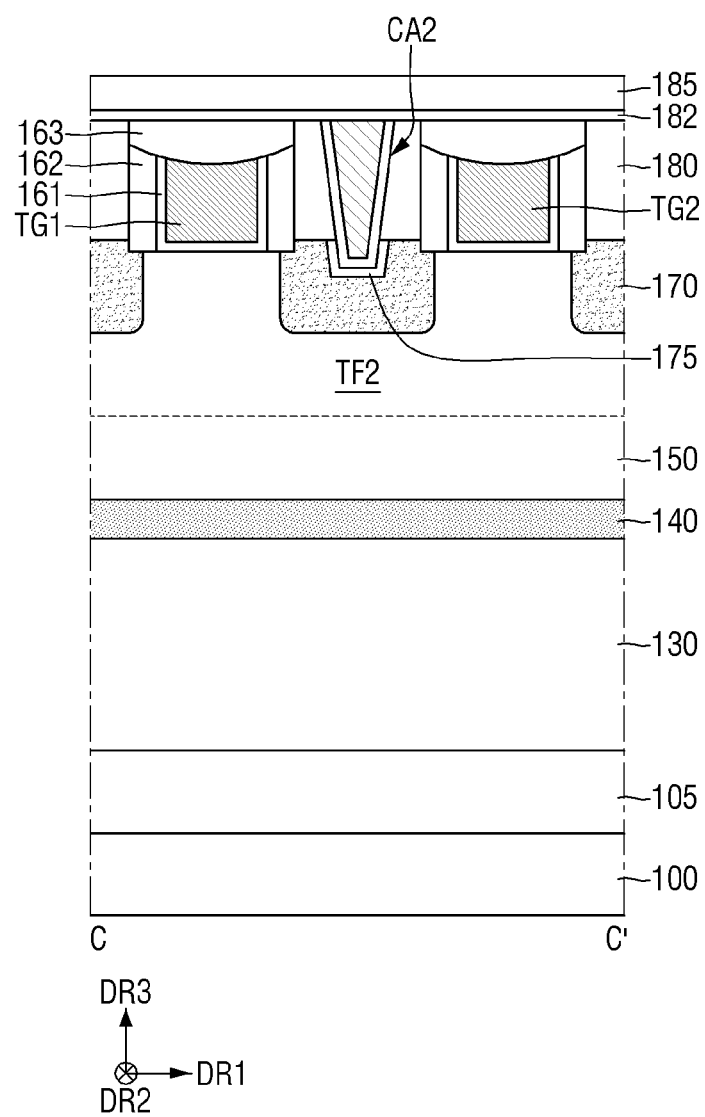
FIG. 4 is a cross-sectional view taken along a line C-C' of FIG. 1.
Figure 5:
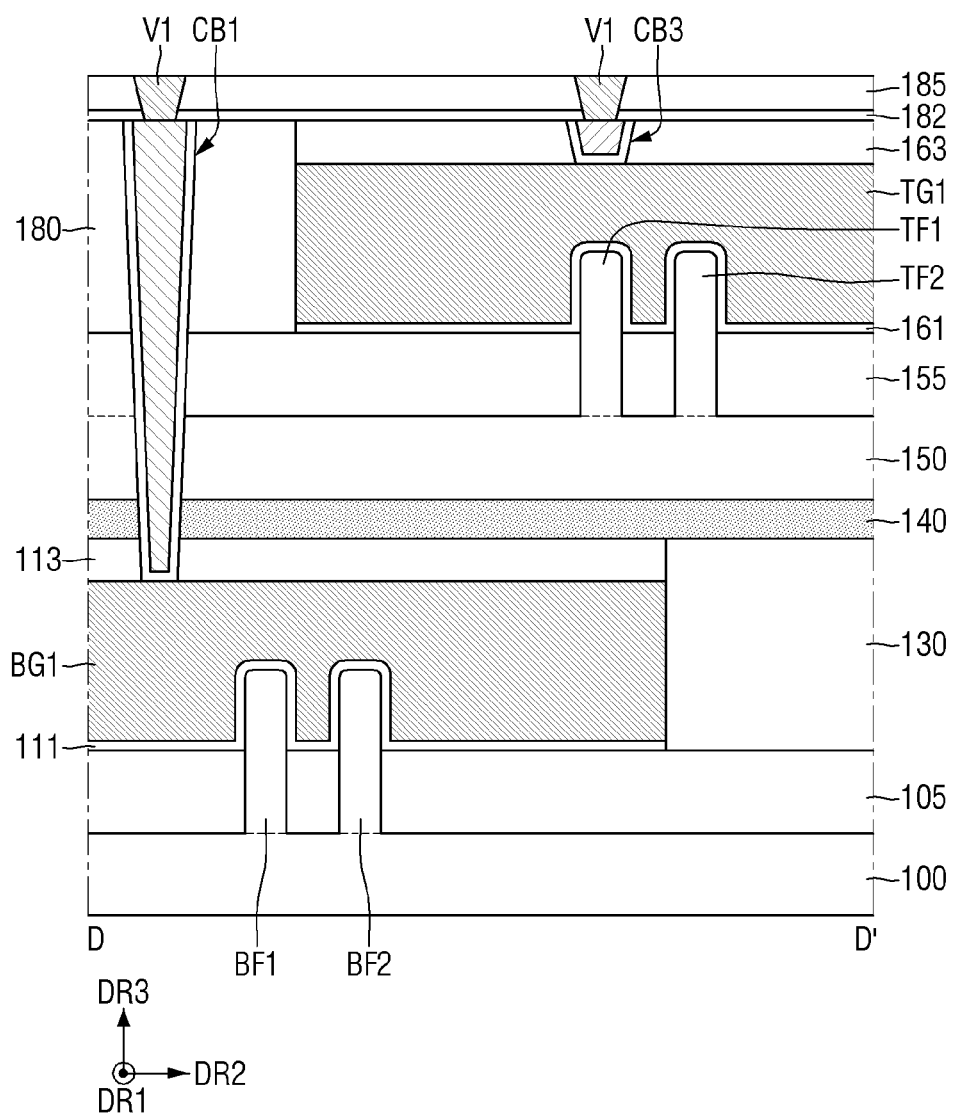
FIG. 5 is a cross-sectional view taken along a line D-D' of FIG. 1.
Figure 6:
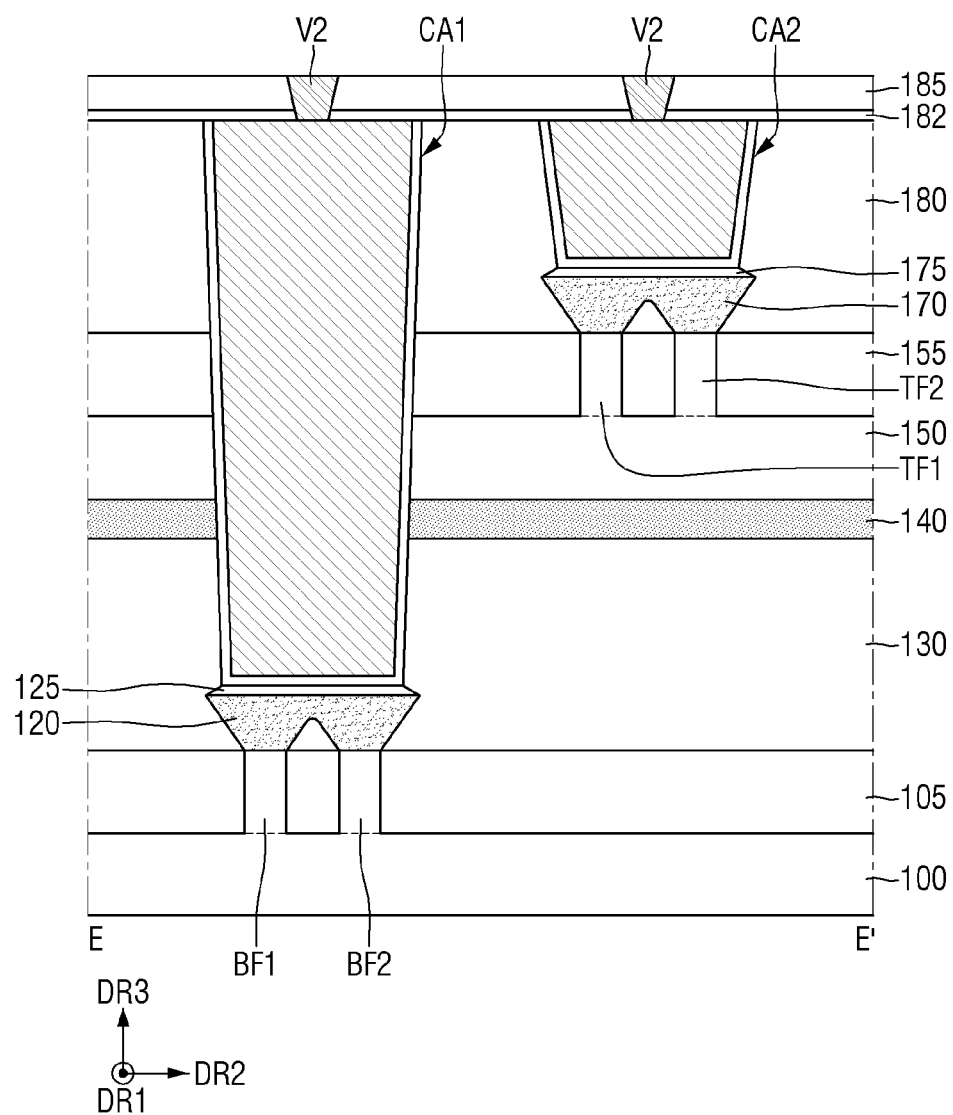
FIG. 6 is a cross-sectional view taken along a line E-E' of FIG. 1.
Figure 7:
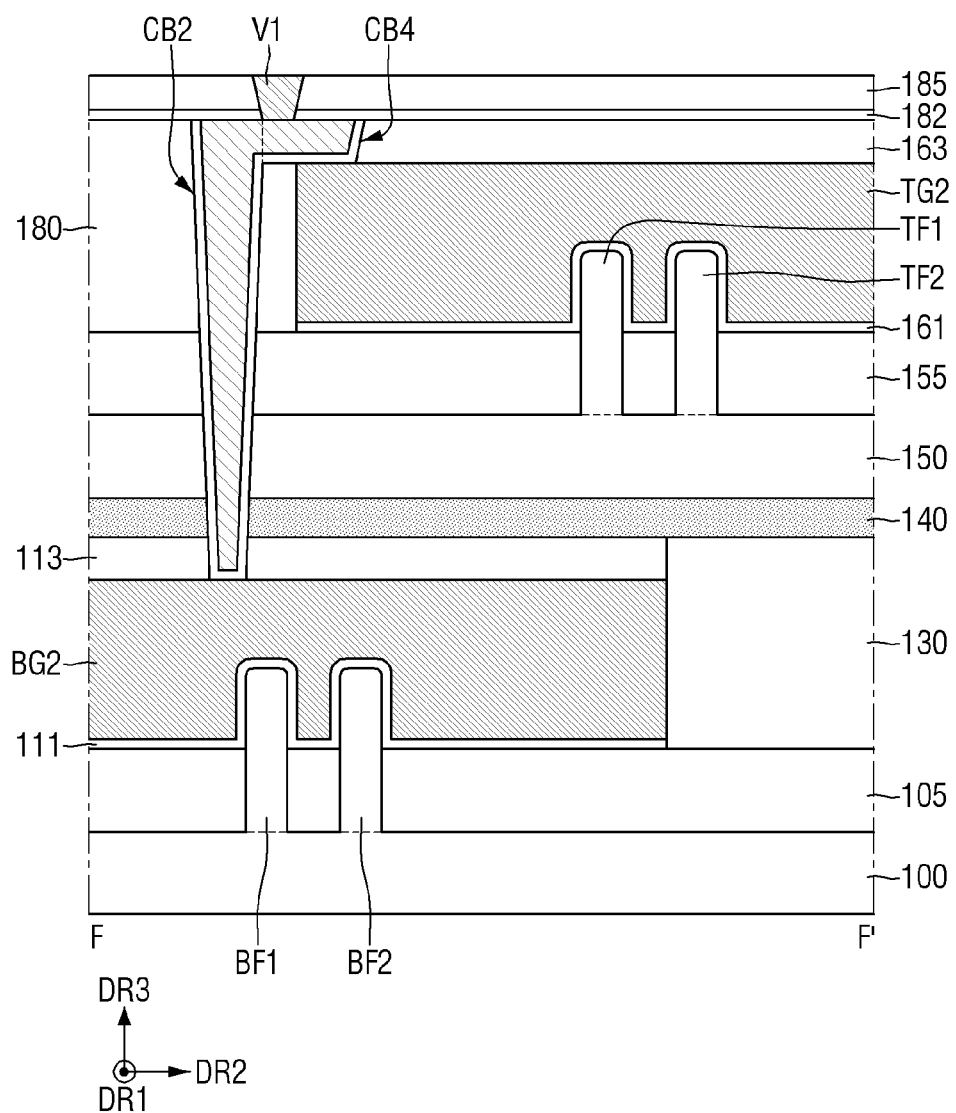
FIG. 7 is a cross-sectional view taken along a line F-F' of FIG. 1.

FIG. 1 is a layout diagram for explaining a semiconductor device according to some embodiments. FIG. 2 is a cross-sectional view taken along the line A-A' of FIG. 1. FIG. 3 is a cross-sectional view taken along the line B-B' of FIG. 1. FIG. 4 is a cross-sectional view taken along the line C-C' of FIG. 1. FIG. 5 is a cross-sectional view taken along the line D-D' of FIG. 1. FIG. 6 is a cross-sectional view taken along the line E-E' of FIG. 1. FIG. 7 is a cross-sectional view taken along the line F-F' of FIG. 1.

Referring to FIGS. 1 to 7, the semiconductor device according to some embodiments includes a lower substrate 100, a lower field insulating layer 105, first and second lower active patterns BF1 and BF2, first and second lower gate electrodes BG1 and BG2, a lower gate insulating layer 111, a lower gate spacer 112, a lower capping pattern 113, a lower source/drain region 120, a lower silicide layer 125, a lower interlayer insulating layer 130, a junction 140, an upper substrate 150, an upper field insulating layer 155, first and second upper active patterns TF1 and TF2, first and second upper gate electrodes TG1 and TG2, an upper gate insulating layer 161, an upper gate spacer 162, an upper capping pattern 163, an upper source/drain region 170, an upper silicide layer 175, a first upper interlayer insulating layer 180, an etching stop layer 182, a second upper interlayer insulating layer 185, first to fourth gate contacts CB1, CB2, CB3 and CB4, first and second source/drain contacts CA1 and CA2, first and second vias V1 and V2.

The lower substrate 100 may be disposed, for example, in a PMOS region. The lower substrate 100 may be a silicon substrate or a silicon-on-insulator (SOI). The lower substrate 100 may include silicon germanium, silicon germanium on insulator (SGOI), indium antimonide, lead tellurium compounds, indium arsenide, indium phosphide, gallium arsenide or gallium antimonide. However, embodiments are not limited thereto.

Each of the first and second lower active patterns BF1 and BF2 may protrude from the lower substrate 100 in a vertical direction DR3. Each of the first and second lower active patterns BF1 and BF2 may extend in a first horizontal direction DR1. The second lower active pattern BF2 may be spaced apart from the first lower active pattern BF1 in a second horizontal direction DR2 different from the first horizontal direction DR1. Here, the vertical direction DR3 may be perpendicular to each of the first horizontal direction DR1 and the second horizontal direction DR2. Each of the first and second lower active patterns BF1 and BF2 may be a part of the lower substrate 100, or may include an epitaxial layer that is grown from the lower substrate 100.

The lower field insulating layer 105 may be disposed on the lower substrate 100. The lower field insulating layer 105 may surround the side walls of each of the first and second lower active patterns BF1 and BF2. For example, each of the first and second lower active patterns BF1 and BF2 may protrude in the vertical direction DR3 beyond the upper surface of the lower field insulating layer 105. The lower field insulating layer 105 may include, for example, an oxide film, a nitride film, an oxynitride film or a combination film thereof.

Each of the first and second lower gate electrodes BG1 and BG2 may extend in the second horizontal direction DR2 on the first and second lower active patterns BF1 and BF2. The second lower gate electrode BG2 may be spaced apart from the first lower gate electrode BG1 in the first horizontal direction DR1.

For example, the upper surfaces of each of the first and second lower gate electrodes BG1 and BG2 may be formed to be higher than the uppermost surfaces of each of the first and second lower active patterns BF1 and BF2. That is, each of the first and second lower gate electrodes BG1 and BG2 may cover the uppermost surfaces of each of the first and second lower active patterns BF1 and BF2.

Each of the first and second lower gate electrodes BG1 and BG2 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first and second lower gate electrodes BG1 and BG2 may include a conductive metal oxide, a conductive metal oxynitride, and the like, and may also include an oxidized form of the above-mentioned materials.

The lower gate spacer 112 may be disposed on the first lower active pattern BF1, the second lower active pattern BF2, and the lower field insulating layer 105. The lower gate spacer 112 may extend in the second horizontal direction DR2 along the side walls of each of the first lower gate electrode BG1 and the second lower gate electrode BG2. The lower gate spacer 112 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The lower gate insulating layer 111 may be disposed between each of the first and second lower gate electrodes BG1 and BG2 and the lower gate spacer 112. The lower gate insulating layer 111 may be disposed between each of the first and second lower gate electrodes BG1 and BG2 and each of the first and second lower active patterns BF1 and BF2. The lower gate insulating layer 111 may be disposed between each of the first and second lower gate electrodes BG1 and BG2 and the lower field insulating layer 105.

The lower gate insulating layer 111 may include at least one of silicon oxide, silicon oxynitride, silicon nitride or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some other embodiments may include a Negative Capacitance (NC) FET that uses a negative capacitor. For example, the lower gate insulating layer 111 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be a positive value that is greater than an absolute value of each individual capacitance.

When the ferroelectric material film having the negative capacitance and the paraelectric material film having the positive capacitance are connected in series, the overall capacitance values of the ferroelectric material film and the paraelectric material film connected in series may increase. Due to the increased overall capacitance value, a transistor including the ferroelectric material film may have a sub-threshold swing (SS) of 60 mV/decade or less at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness corresponding to the ferroelectric properties. The thickness of the ferroelectric material film may be, but is not limited to, for example, 0.5 to 10 nm. Because a critical thickness that exhibits the ferroelectric properties may vary for each ferroelectric material, the thickness of the ferroelectric material film may vary depending on the ferroelectric material.

As an example, the lower gate insulating layer 111 may include one ferroelectric material film. As another example, the lower gate insulating layer 111 may include a plurality of ferroelectric material films spaced apart from each other. The lower gate insulating layer 111 may have a stacked film structure in which a plurality of ferroelectric material films and a plurality of paraelectric material films are alternately stacked.

The lower capping pattern 113 may extend in the second horizontal direction DR2 on each of the first lower gate electrode BG1 and the second lower gate electrode BG2. For example, the lower capping pattern 113 may be in contact with the uppermost surface of the lower gate insulating layer 111 and the upper surface of the lower gate spacer 112. However, embodiments are not limited thereto. In some other embodiments, the lower capping pattern 113 may be disposed between the lower gate spacers 112. The lower capping pattern 113 may include, for example, at least one of silicon nitride (SiN), silicon oxynitride (SiON), silicon oxide (SiO$_2$), silicon carbonitride (SiCN), silicon oxycarbonitride (SiOCN), and a combination thereof.

The lower source/drain region 120 may be disposed on each of the first and second lower active patterns BF1 and BF2. The lower source/drain region 120 may be disposed on at least one side of each of the first and second lower gate electrodes BG1 and BG2. For example, the lower source/drain region 120 may be disposed on both sides of each of the first and second lower gate electrodes BG1 and BG2. Although FIG. 2 shows that the upper surface of the lower source/drain region 120 is formed to be higher than the uppermost surfaces of each of the first and second lower active patterns BF1 and BF2, embodiments are not limited thereto.

The lower interlayer insulating layer 130 may be disposed on the lower field insulating layer 105 to cover the lower gate spacer 112, the lower field insulating layer 105, and the lower source/drain region 120. For example, the lower interlayer insulating layer 130 may surround the side walls of each of the first and second lower gate electrodes BG1 and BG2.

For example, an upper surface of the lower interlayer insulating layer 130 may be formed on the same plane as an upper surface of the lower capping pattern 113. However, embodiments are not limited thereto. In some other embodiments, the lower interlayer insulating layer 130 may cover the upper surface of the lower capping pattern 113.

The lower interlayer insulating layer 130 may include, for example, at least one of silicon oxide, silicon nitride, silicon oxynitride, and a low dielectric constant material. The low dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, embodiments are not limited thereto.

The junction 140 may be disposed on the lower interlayer insulating layer 130 and the lower capping pattern 113. For example, the junction 140 may be in contact with each of the lower interlayer insulating layer 130 and the lower capping pattern 113. For example, the junction 140 may be formed conformally. The junction 140 may include, for example, at least one of silicon oxide, silicon nitride, silicon oxynitride and a low dielectric constant material.

The upper substrate 150 may be disposed on the junction 140. The upper substrate 150 may be in contact with the junction 140. The upper substrate 150 may be disposed, for example, in a NMOS region. The upper substrate 150 may be a silicon substrate or a silicon-on-insulator (SOT). The upper substrate 150 may include, but is not limited to, silicon germanium, SGOI (silicon germanium on insulator), indium antimonide, lead tellurium compounds, indium arsenide, indium phosphide, gallium arsenide or gallium antimonide. However, embodiments are not limited thereto.

Each of the first and second upper active patterns TF1 and TF2 may protrude from the upper substrate 150 in the vertical direction DR3. Each of the first and second upper active patterns TF1 and TF2 may extend in the first horizontal direction DR1. The second upper active pattern TF2 may be spaced apart from the first upper active pattern TF1 in the second horizontal direction DR2. Each of the first and second upper active patterns TF1 and TF2 may be a part of the upper substrate 150, and may include an epitaxial layer that is grown from the upper substrate 150.

For example, each of the first and second upper active patterns TF1 and TF2 may not overlap each of the first and second lower active patterns BF1 and BF2 in the vertical direction DR3. That is, each of the first and second upper active patterns TF1 and TF2 may be spaced apart from each of the first and second lower active patterns BF1 and BF2 in the second horizontal direction DR2 and the vertical direction DR3.

The upper field insulating layer 155 may be disposed on the upper substrate 150. The upper field insulating layer 155 may surround the side walls of each of the first and second upper active patterns TF1 and TF2. For example, each of the first and second upper active patterns TF1 and TF2 may protrude from the upper surface of the upper field insulating layer 155 in the vertical direction DR3. The upper field insulating layer 155 may include, for example, an oxide film, a nitride film, an oxynitride film or a combination film thereof.

Each of the first and second upper gate electrodes TG1 and TG2 may extend in the second horizontal direction DR2 on the first and second upper active patterns TF1 and TF2. The second upper gate electrode TG2 may be spaced apart from the first upper gate electrode TG1 in the first horizontal direction DR1.

At least a part of the first upper gate electrode TG1 may overlap the first lower gate electrode BG1 in the vertical direction DR3. Further, at least a part of the second upper gate electrode TG2 may overlap the second lower gate electrode BG2 in the vertical direction DR3. For example, the first upper gate electrode TG1 and the first lower gate electrode BG1 may overlap in the vertical direction DR3 between the first lower active pattern BF1 and the second upper active pattern TF2. For example, the second upper gate electrode TG2 and the second lower gate electrode BG2 may overlap in the vertical direction DR3 between the first lower active pattern BF1 and the second upper active pattern TF2. However, embodiments are not limited thereto.

For example, the upper surfaces of each of the first and second upper gate electrodes TG1 and TG2 may be formed to be higher than the uppermost surfaces of each of the first and second upper active patterns TF1 and TF2. That is, each of the first and second upper gate electrodes TG1 and TG2 may cover the uppermost surfaces of each of the first and second upper active patterns TF1 and TF2.

Each of the first and second upper gate electrodes TG1 and TG2 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first and second upper gate electrodes TG1 and TG2 may include a conductive metal oxide, a conductive metal oxynitride, and the like, and may also include an oxidized form of the above-mentioned materials.

The upper gate spacer 162 may be disposed on the first upper active pattern TF1, the second upper active pattern TF2, and the upper field insulating layer 155. The upper gate spacer 162 may extend in the second horizontal direction DR2 along the side walls of each of the first upper gate electrode TG1 and the second upper gate electrode TG2. The upper gate spacer 162 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The upper gate insulating layer 161 may be disposed between the upper gate spacer 162 and each of the first and second upper gate electrodes TG1 and TG2. The upper gate insulating layer 161 may be disposed between each of the first and second upper gate electrodes TG1 and TG2 and each of the first and second upper active patterns TF1 and TF2. The upper gate insulating layer 161 may be disposed between the upper field insulating layer 155 and each of the first and second upper gate electrodes TG1 and TG2. The upper gate insulating layer 161 may include at least one of silicon oxide, silicon oxynitride, silicon nitride or a high dielectric constant material having a higher dielectric constant than silicon oxide.

The upper capping pattern 163 may extend in the second horizontal direction DR2 on each of the first upper gate electrode TG1 and the second upper gate electrode TG2. For example, the upper capping pattern 163 may be in contact with the uppermost surface of the upper gate insulating layer 161 and the upper surface of the upper gate spacer 162. However, embodiments are not limited thereto. In some other embodiments, the upper capping pattern 163 may be disposed between the upper gate spacers 162. The upper capping pattern 163 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

The upper source/drain region 170 may be disposed on each of the first and second upper active patterns TF1 and TF2. The upper source/drain region 170 may be disposed on at least one side of each of the first and second upper gate electrodes TG1 and TG2. For example, the upper source/drain region 170 may be disposed on both sides of each of the first and second upper gate electrodes TG1 and TG2. Although FIGS. 3 and 4 show that the upper surface of the upper source/drain region 170 is formed to be higher than the uppermost surfaces of each of the first and second upper active patterns TF1 and TF2, embodiments are not limited thereto.

For example, the upper source/drain region 170 may not overlap the lower source/drain region 120 in the vertical direction DR3. That is, the upper source/drain region 170 may be spaced apart from the lower source/drain region 120 in each of the second horizontal direction DR2 and the vertical direction DR3.

The first upper interlayer insulating layer 180 may be disposed on the upper field insulating layer 155 to cover the upper gate spacer 162, the upper field insulating layer 155, and the upper source/drain region 170. For example, the first upper interlayer insulating layer 180 may surround the side walls of each of the first and second upper gate electrodes TG1 and TG2.

For example, the upper surface of the first upper interlayer insulating layer 180 may be formed on the same plane as the upper surface of the upper capping pattern 163. However, embodiments are not limited thereto. In some other embodiments, the first upper interlayer insulating layer 180 may cover the upper surface of the upper capping pattern 163. The first upper interlayer insulating layer 180 may include, for example, at least one of silicon oxide, silicon nitride, silicon oxynitride, and a low dielectric constant material.

A first gate contact CB1 may be disposed on the first lower gate electrode BG1. The first gate contact CB1 may be spaced apart from the first upper gate electrode TG1 in the second horizontal direction DR2. The first gate contact CB1 may penetrate the first upper interlayer insulating layer 180, the upper field insulating layer 155, the upper substrate 150, the junction 140, and the lower capping pattern 113 in the vertical direction DR3, and may be connected to the first lower gate electrode BG1.

A second gate contact CB2 may be disposed on the second lower gate electrode BG2. The second gate contact CB2 may be spaced apart from the second upper gate electrode TG2 in the second horizontal direction DR2. The second gate contact CB2 may penetrate the first upper interlayer insulating layer 180, the upper field insulating layer 155, the upper substrate 150, the junction 140, and the lower capping pattern 113 in the vertical direction DR3, and may be connected to the second lower gate electrode BG2.

A third gate contact CB3 may be disposed on the first upper gate electrode TG1. The third gate contact CB3 may be spaced apart from the first gate contact CB1 in the second horizontal direction DR2. The third gate contact CB3 may penetrate the upper capping pattern 163 in the vertical direction DR3, and may be connected to the first upper gate electrode TG1. Although FIG. 5 shows that the third gate contact CB3 overlaps each of the first lower gate electrode BG1 and the first upper active pattern TF1 in the vertical direction DR3, this is an example, and embodiments are not limited thereto.

A fourth gate contact CB4 may be disposed on the second upper gate electrode TG2. The fourth gate contact CB4 may be in contact with the second gate contact CB2. The fourth gate contact CB4 may penetrate the upper capping pattern 163 and the first upper interlayer insulating layer 180 in the vertical direction DR3, and may be connected to the second upper gate electrode TG2. For example, the lower surface of a part of the fourth gate contact CB4 may be in contact with second upper gate electrode TG2, and the lower surface of the remaining part of the fourth gate contact CB4 may be in contact with the first upper interlayer insulating layer 180.

For example, the upper surface of the first gate contact CB1 may be formed to be higher than the upper surface of the first upper gate electrode TG1. Further, the upper surface of the third gate contact CB3 may be formed to be higher than the upper surface of the second upper gate electrode TG2. For example, the upper surfaces of each of the first to fourth gate contacts CB1, CB2, CB3, and CB4 may be formed on the same plane as the upper surface of the first upper interlayer insulating layer 180 and the upper capping pattern 163.

Each of the first to fourth gate contacts CB1, CB2, CB3, and CB4 may include a first barrier layer 191_1 and a first filling layer 192_1. For example, the first barrier layer 191_1 may form side walls and bottom surfaces of each of the first to fourth gate contacts CB1, CB2, CB3, and CB4. However, the first barrier layer 191_1 may not be disposed at the portion in which the second gate contact CB2 and the fourth gate contact CB4 may be in contact with each other. The first filling layer 192_1 may be disposed on the first barrier layer 191_1. For example, the first filling layer 192_1 disposed in the second gate contact CB2 may be in contact with the first filling layer 192_1 disposed in the fourth gate contact CB4.

The first barrier layer 191_1 may include, for example, at least one of tantalum (Ta), tantalum nitride (TaN), titanium (Ti), titanium nitride (TiN), ruthenium (Ru), cobalt (Co), nickel (Ni), nickel boron (Ni), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh). The first filling layer 192_1 may include, for example, at least one of aluminum (Al), tungsten (W), cobalt (Co), ruthenium (Ru), and molybdenum (Mo).

A first source/drain contact CA1 may extend in the second horizontal direction DR2 on the lower source/drain region 120. The first source/drain contact CA1 may penetrate the first upper interlayer insulating layer 180, the upper field insulating layer 155, the upper substrate 150, the junction 140, and the lower interlayer insulating layer 130 in the vertical direction DR3, and may be connected to the lower source/drain region 120.

A second source/drain contact CA2 may extend in the second horizontal direction DR2 on the upper source/drain region 170. For example, the second source/drain contact CA2 may be spaced apart from the first source/drain contact CA1 in the second horizontal direction DR2. The second source/drain contact CA2 may penetrate the first upper interlayer insulating layer 180 in the vertical direction DR3, and may be connected to the upper source/drain region 170.

For example, the upper surface of the first source/drain contact CA1 may be formed on the same plane as the upper surface of the second source/drain contact CA2. For example, the upper surfaces of each of the first and second source/drain contacts CA1 and CA2 may be formed on the same plane as the upper surface of the first upper interlayer insulating layer 180 and the upper capping pattern 163. Each of the first and second source/drain contacts CA1 and CA2 may include a second barrier layer 191_2 and a second filling layer 192_2. For example, the second barrier layer 191_2 may form the side walls and bottom surfaces of each of the first and second source/drain contacts CA1 and CA2. The second filling layer 192_2 may be disposed on the second barrier layer 191_2.

The second barrier layer 191_2 may include, for example, at least one of tantalum (Ta), tantalum nitride (TaN), titanium (Ti), titanium nitride (TiN), ruthenium (Ru), cobalt (Co), nickel (Ni), nickel boron (Ni), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh). The second filling layer 192_2 may include, for example, at least one of aluminum (Al), tungsten (W), cobalt (Co), ruthenium (Ru), and molybdenum (Mo).

The lower silicide layer 125 may be disposed between the lower source/drain region 120 and the first source/drain contact CAL The upper silicide layer 175 may be disposed between the upper source/drain region 170 and the second source/drain contact CA2. Each of the lower silicide layer 125 and the upper silicide layer 175 may include, for example, a metal silicide material.

The etching stop layer 182 may be disposed on the upper surfaces of each of the first upper interlayer insulating layer 180, the first to fourth gate contacts CB1, CB2, CB3 and CB4, the first and second source/drain contacts CA1 and CA2, and the upper capping pattern 163. The etching stop layer 182 may include, for example, at least one of silicon oxide, silicon nitride, silicon oxynitride, and a low dielectric constant material. The second upper interlayer insulating layer 185 may be disposed on the etching stop layer 182. The second upper interlayer insulating layer 185 may include, for example, at least one of silicon oxide, silicon nitride, silicon oxynitride, and a low dielectric constant material.

A first via V1 may penetrate the second upper interlayer insulating layer 185 and the etching stop layer 182 in the vertical direction DR3, and may be connected to any one of the first to fourth gate contacts CB1, CB2, CB3, and CB4. Although FIG. 7 shows that the first via V1 is connected to the fourth gate contact CB4, this is an example, and embodiments are not limited thereto. In some other embodiments, the first via V1 may be connected to the second gate contact CB2.

Although FIGS. 2 to 7 show that the first via V1 is formed of a single film, this is for convenience of explanation, and embodiments are not limited thereto. That is, the first via V1 may be formed of multiple films. The first via V1 may include a conductive material.

A second via V2 may penetrate the second upper interlayer insulating layer 185 and the etching stop layer 182 in the vertical direction DR3, and may be connected to any one of the first and second source/drain contacts CA1 and CA2. Although FIG. 6 shows that the second via V2 is formed of a single film, this is for convenience of explanation, and embodiments are not limited thereto. That is, the second via V2 may be formed of multiple films. The second via V2 may include a conductive material.

Hereinafter, a method for fabricating a semiconductor device according to some embodiments will be described referring to FIGS. 1 to 23.

FIGS. 8 to 23 are intermediate step diagrams for explaining the method for fabricating the semiconductor device according to some embodiments.

Figure 8:
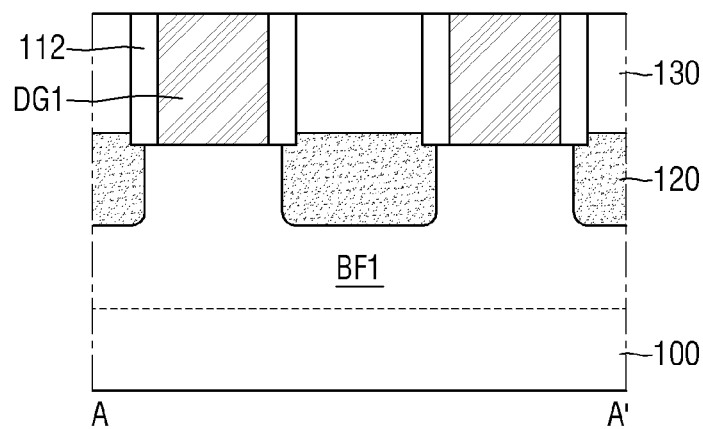
FIGS. 8 to 23 are intermediate step diagrams for explaining a method for fabricating a semiconductor device according to some embodiments.
Figure 9:
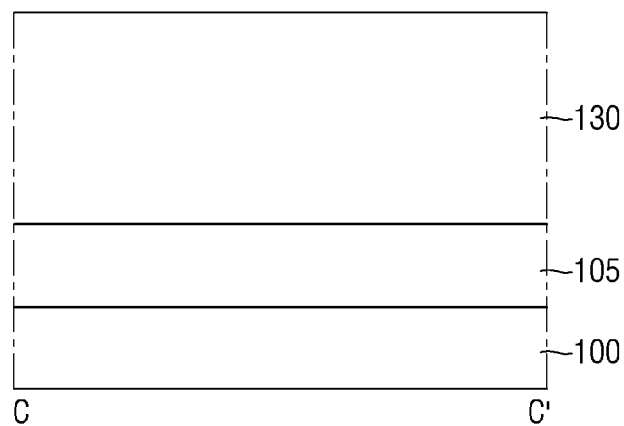
Figure 10:
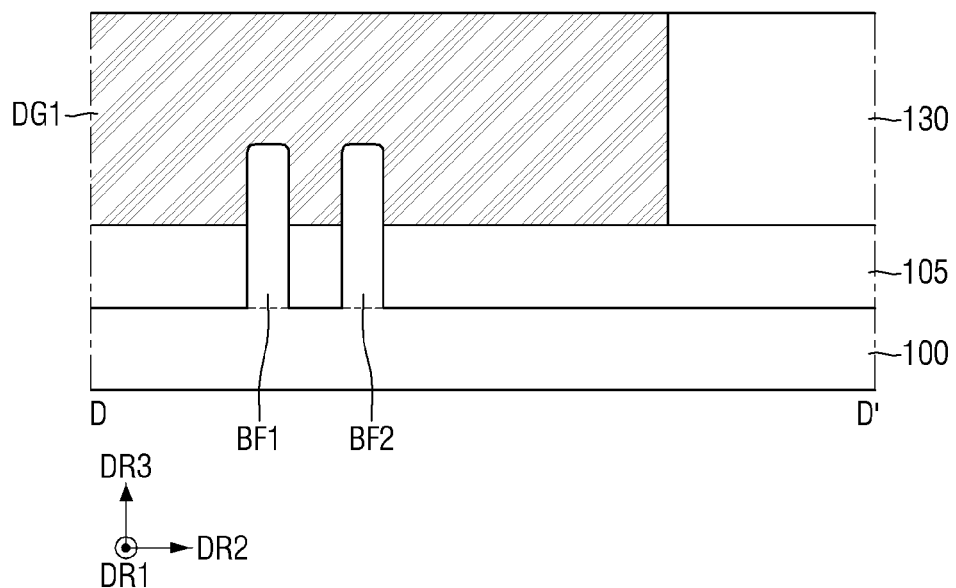

Referring to FIGS. 8 to 10, first and second lower active patterns BF1 and BF2, each extending in the first horizontal direction DR1, may be formed on the lower substrate 100. A lower field insulating layer 105 that surrounds the side walls of each of the first and second lower active patterns BF1 and BF2 may be formed on the lower substrate 100.

A plurality of first dummy gates DG1, each extending in the second horizontal direction DR2, may be formed on the lower field insulating layer 105, and the first and second lower active patterns BF1 and BF2. A lower gate spacer 112 extending in the second horizontal direction DR2 along the side walls of the plurality of first dummy gates DG1 may be formed.

Lower source/drain regions 120 may be formed on both sides of the plurality of first dummy gates DG1 on the first and second lower active patterns BF1 and BF2. A lower interlayer insulating layer 130 that covers the lower field insulating layer 105, the lower source/drain region 120, the lower gate spacer 112, and the plurality of first dummy gates DG1 may be formed. A flattening process (for example, a chemical mechanical polishing (CMP) process) may be performed to expose the upper surfaces of the plurality of first dummy gates DG1.

Figure 11:
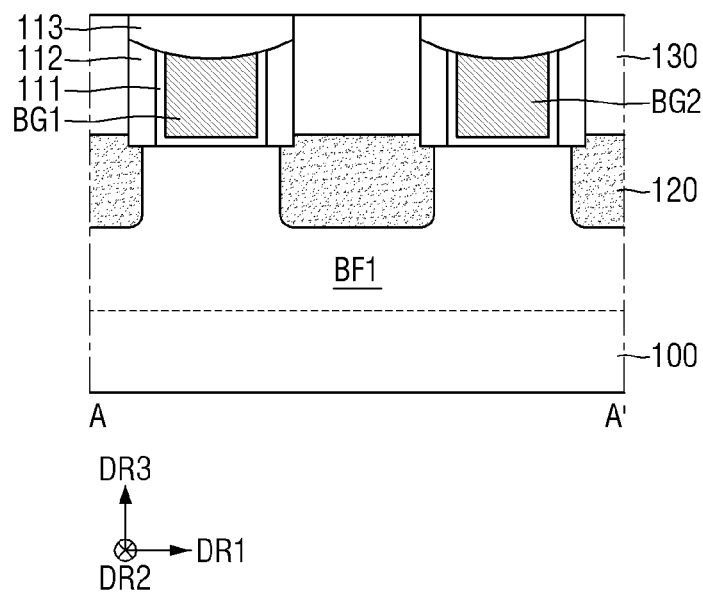
Figure 12:
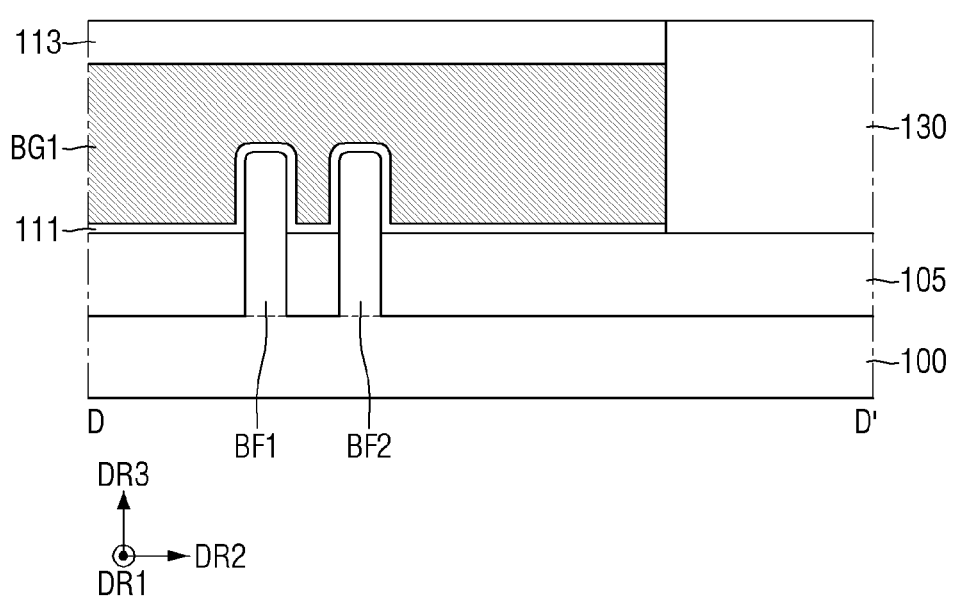

Referring to FIGS. 11 and 12, the plurality of first dummy gates DG1 may be removed. The lower gate insulating layer 111, and the first and second lower gate electrodes BG1 and BG2 may be sequentially formed in the portion from which the plurality of first dummy gates DG1 are removed. The lower capping pattern 113 may be formed on the lower gate spacer 112, the lower gate insulating layer 111, the first and second lower gate electrodes BG1 and BG2. For example, the upper surface of the lower capping pattern 113 and the upper surface of the lower interlayer insulating layer 130 may be formed on the same plane.

Figure 13:
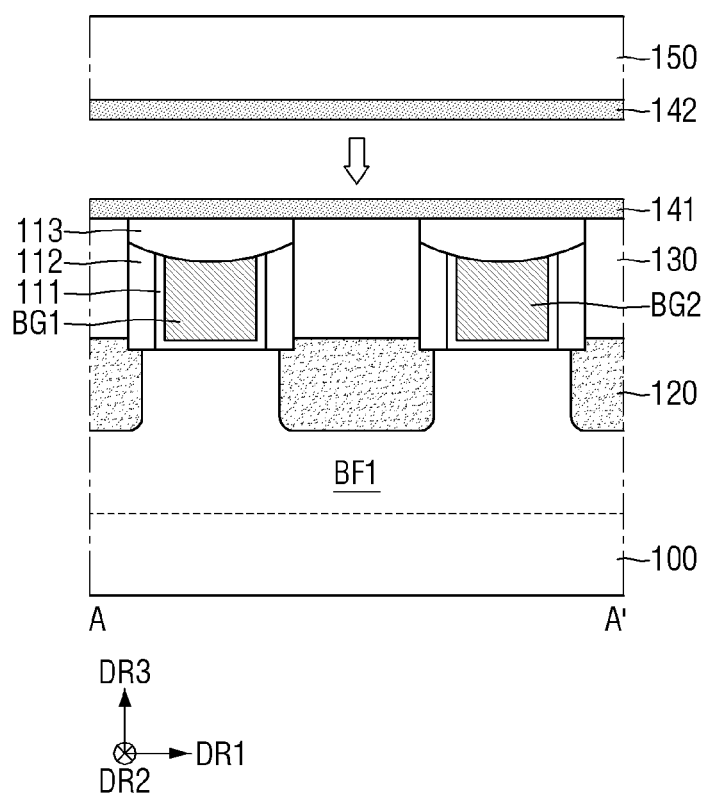
Figure 14:
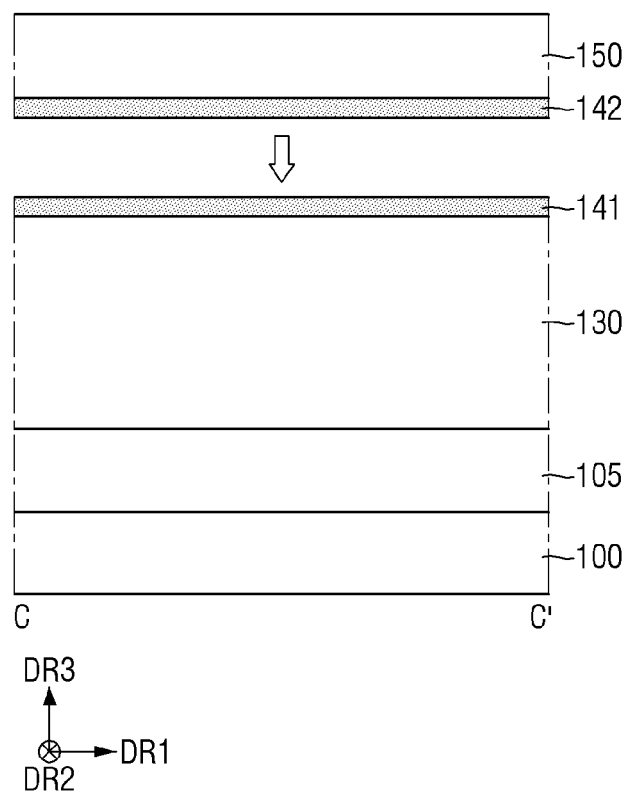
Figure 15:
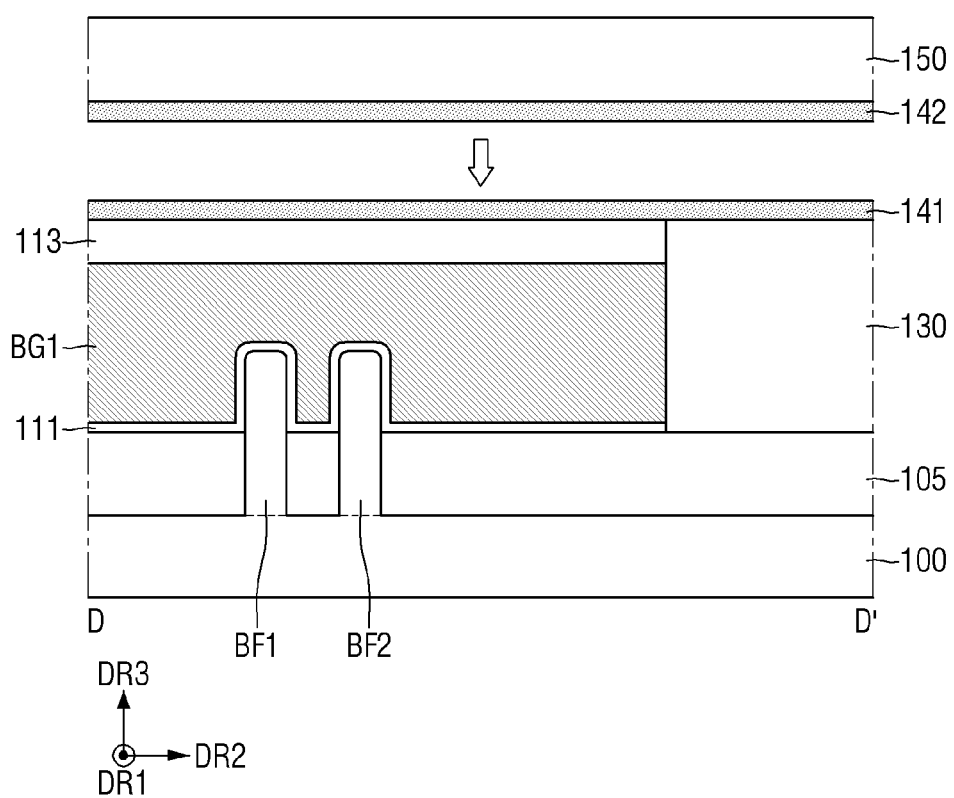

Referring to FIGS. 13 to 15, a first junction 141 may be formed on the upper surface of the lower capping pattern 113 and the upper surface of the lower interlayer insulating layer 130. For example, the first junction 141 may be formed conformally. A structure including the upper substrate 150 and a second junction 142 formed below the upper substrate 150 may be attached to the first junction 141. In this case, the structure may be attached onto the lower interlayer insulating layer 130 so that the second junction 142 faces the first junction 141.

Figure 16:
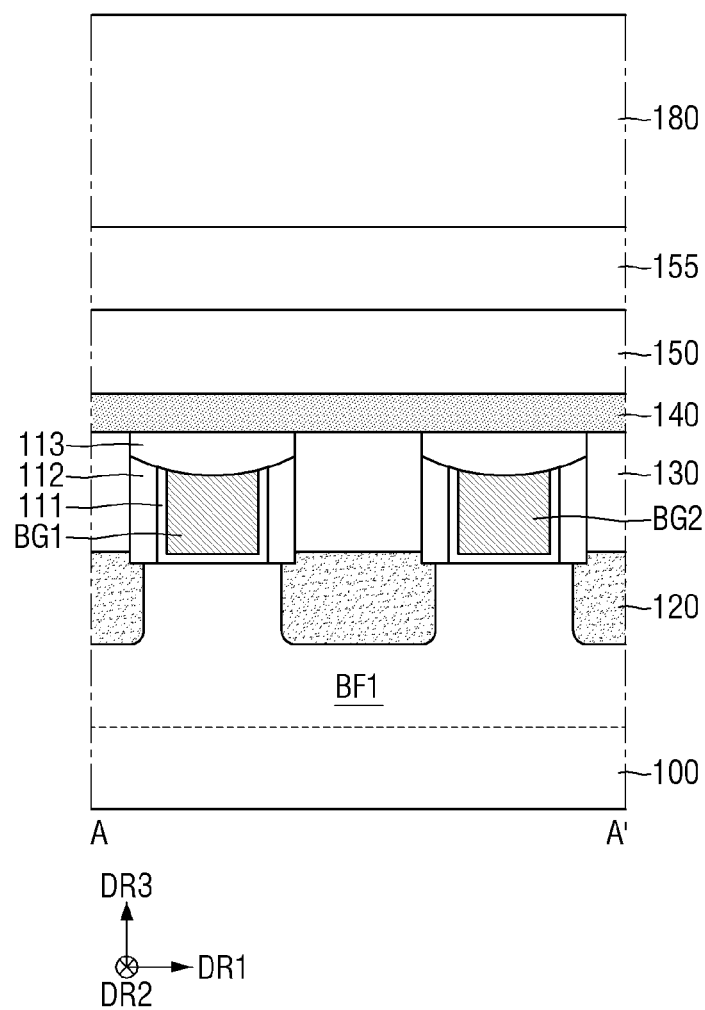
Figure 17:
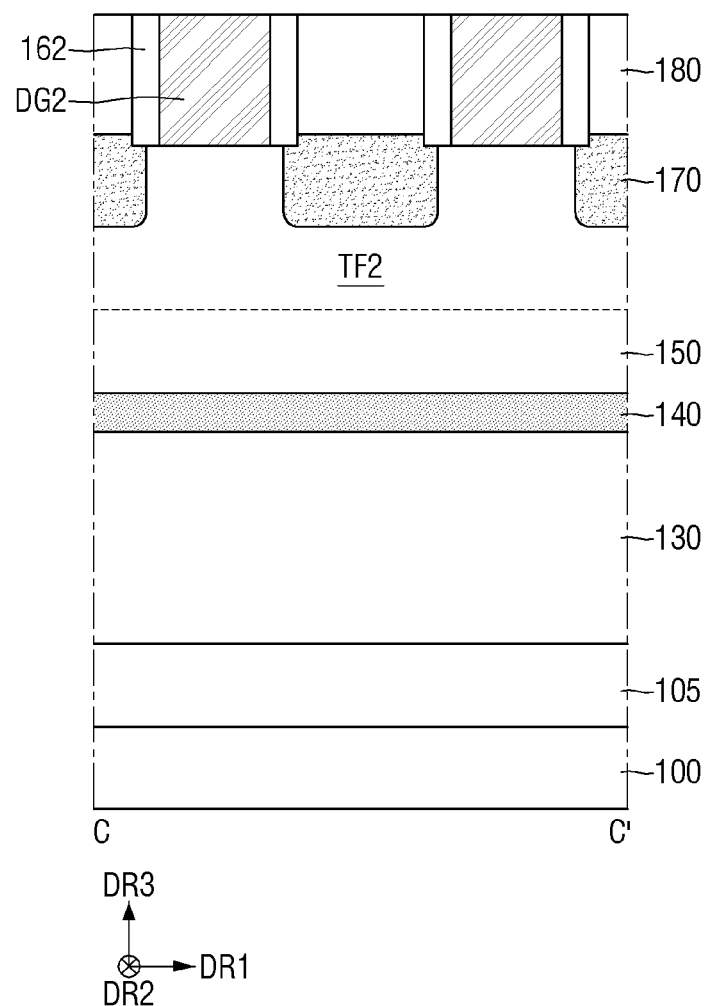
Figure 18:
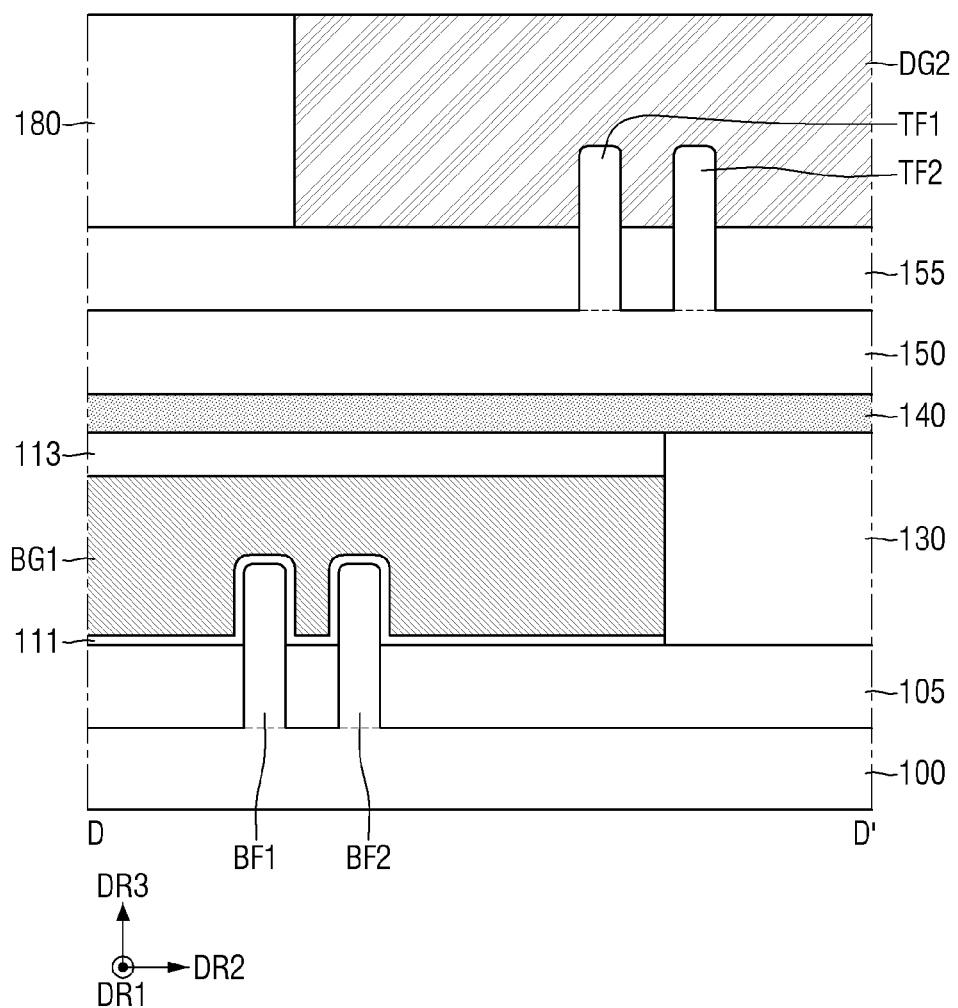

Referring to FIGS. 16 to 18, the second junction 142 may be attached to the first junction 141 to form the junction 140. The upper substrate 150 may be epitaxially grown. A part of the upper substrate 150 may be etched to form the first and second upper active patterns TF1 and TF2, each of which extends in the first horizontal direction DR1. Each of the first and second upper active patterns TF1 and TF2 may be formed so as to be spaced apart from each of the first and second lower active patterns BF1 and BF2 in the second horizontal direction DR2.

An upper field insulating layer 155 that surrounds the side walls of each of the first and second upper active patterns TF1 and TF2 may be formed on the upper substrate 150. A plurality of second dummy gates DG2, each extending in the second horizontal direction DR2, may be formed on the upper field insulating layer 155, and the first and second upper active patterns TF1 and TF2. At least a part of each of the plurality of second dummy gates DG2 may be formed to overlap each of the first and second lower gate electrodes BG1 and BG2 in the vertical direction DR3. An upper gate spacer 162 extending in the second horizontal direction DR2 along the side walls of the plurality of second dummy gates DG2 may be formed.

Upper source/drain regions 170 may be formed on both sides of the plurality of second dummy gates DG2 on the first and second upper active patterns TF1 and TF2. A first upper interlayer insulating layer 180 that covers the upper field insulating layer 155, the upper source/drain region 170, the upper gate spacer 162, and the plurality of second dummy gates DG2 may be formed. A flattening process (for example, a CMP process) may be performed to expose the upper surfaces of the plurality of second dummy gates DG2.

Figure 19:
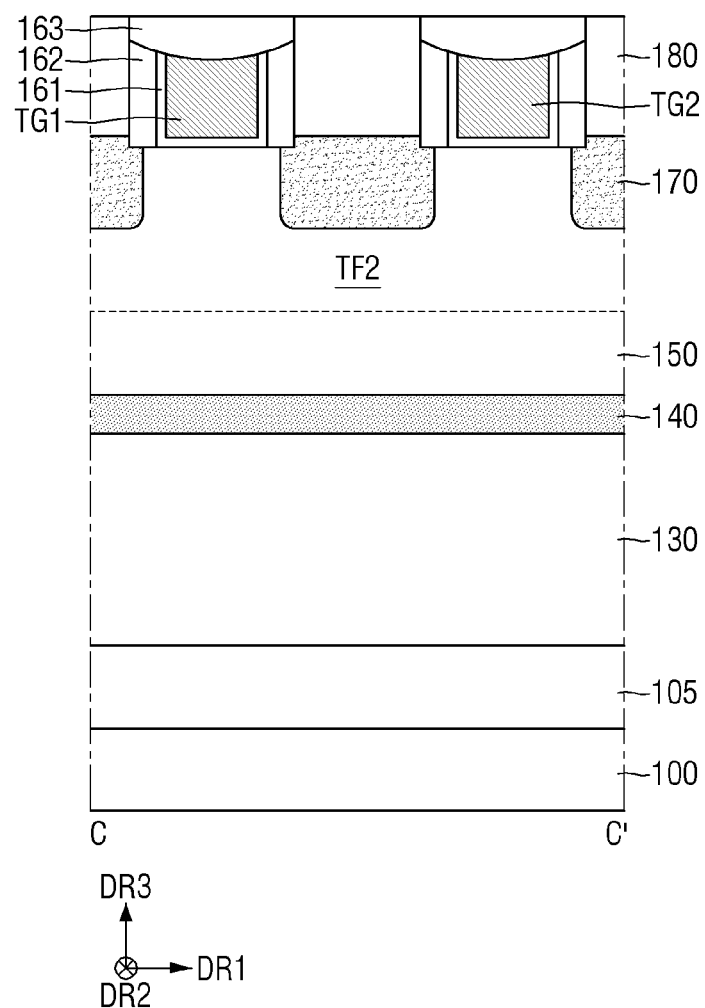
Figure 20:
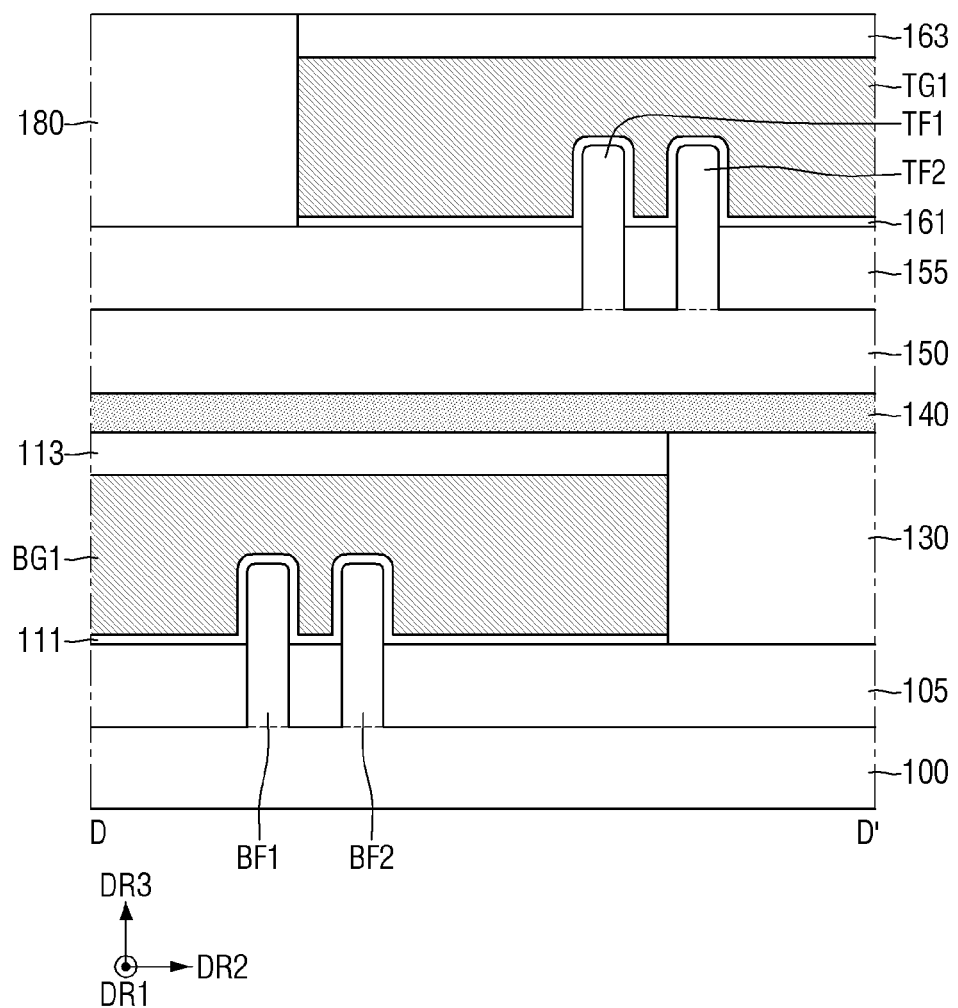

Referring to FIGS. 19 and 20, a plurality of second dummy gates DG2 may be removed. The upper gate insulating layer 161 and the first and second upper gate electrodes TG1 and TG2 may be sequentially formed in the portion from which the plurality of second dummy gates DG2 are removed. The upper capping pattern 163 may be formed on the upper gate spacer 162, the upper gate insulating layer 161 and the first and second upper gate electrodes TG1 and TG2. For example, the upper surface of the upper capping pattern 163 and the upper surface of the first upper interlayer insulating layer 180 may be formed on the same plane.

Figure 21:
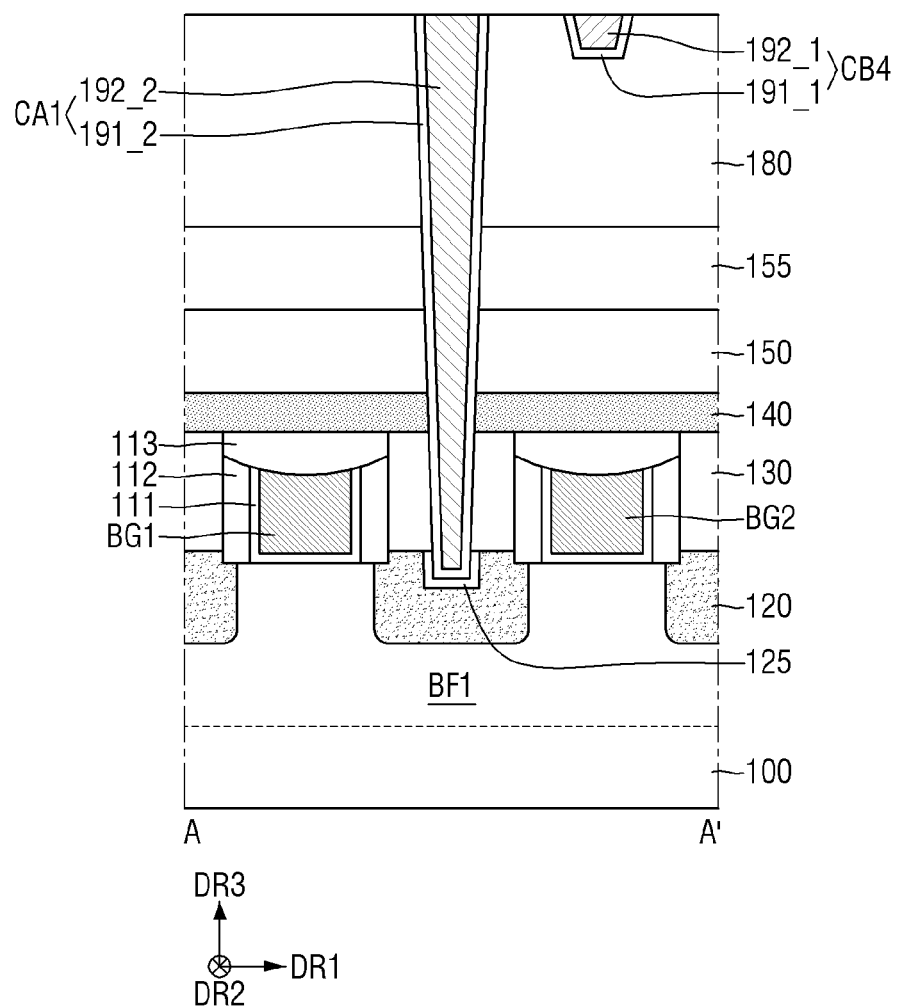
Figure 22:
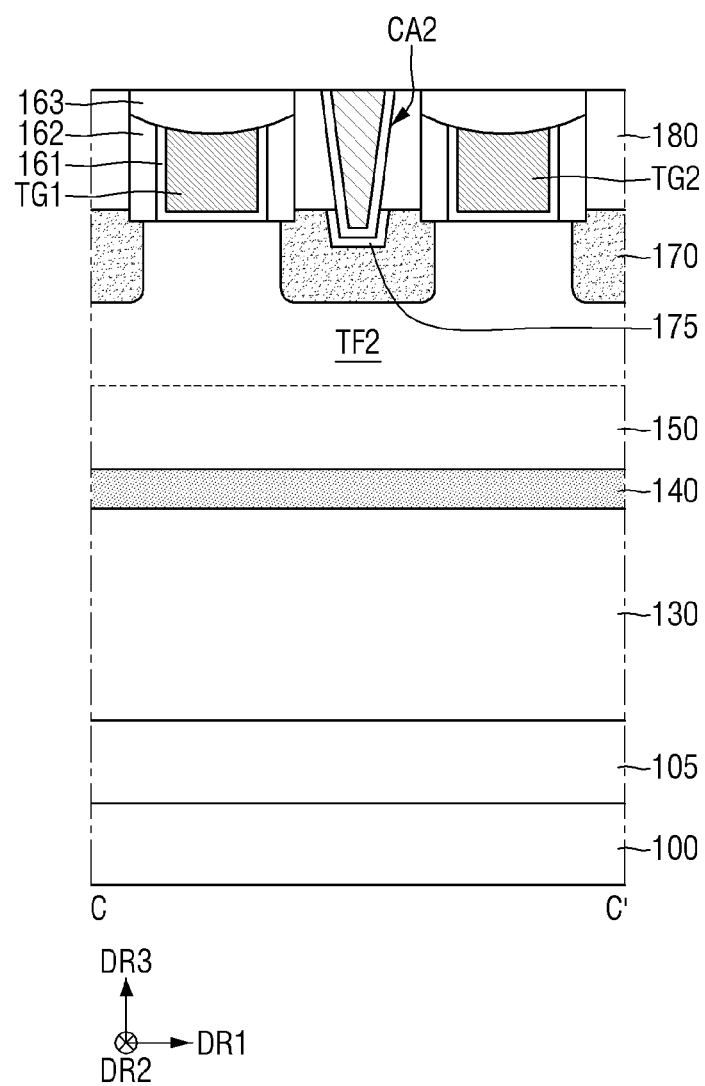
Figure 23:
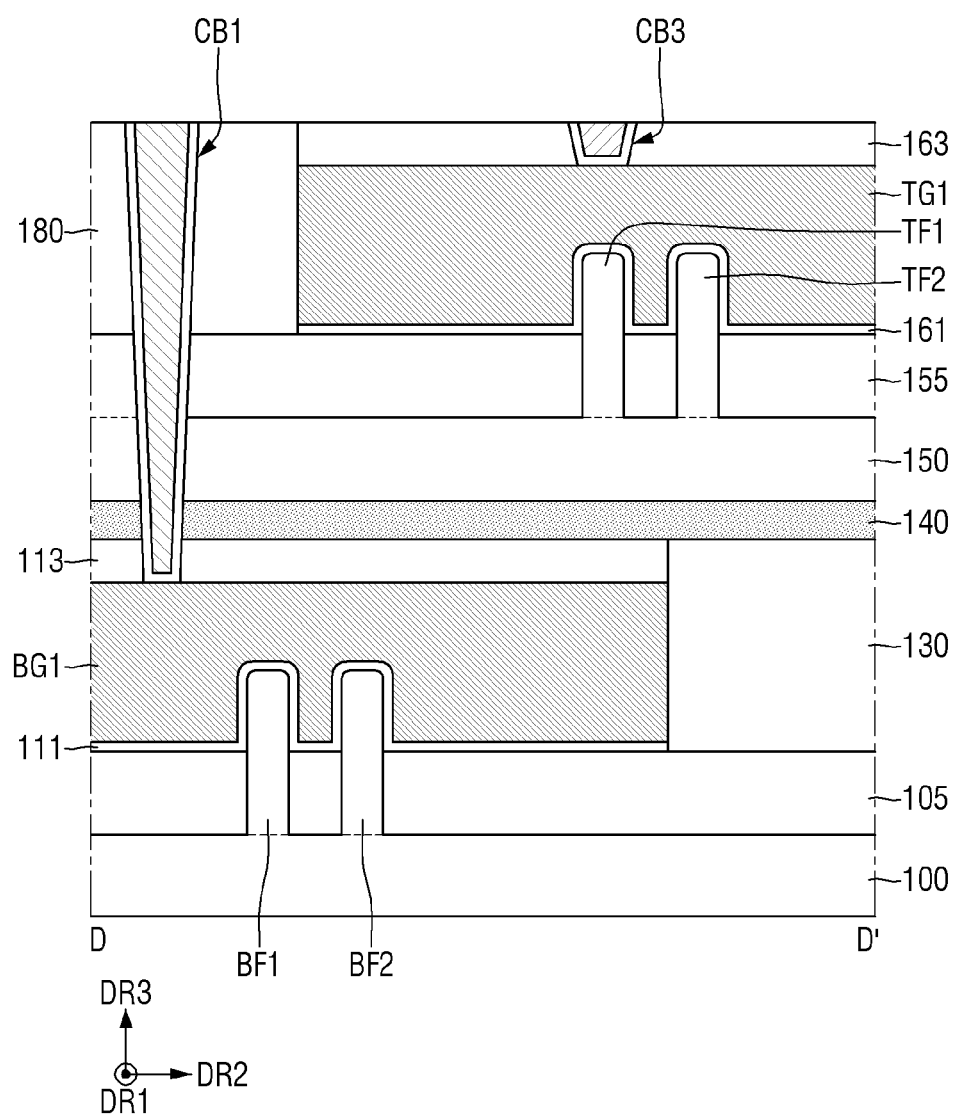

Referring to FIGS. 21 to 23, first and fourth gate contacts CB1, CB2, CB3 and CB4, first and second source/drain contacts CA1 and CA2 may be formed.

For example, a first gate contact CB1 that penetrates the first upper interlayer insulating layer 180, the upper field insulating layer 155, the upper substrate 150, the junction 140, and the lower capping pattern 113 in the vertical direction DR3 and is connected to the first lower gate electrode BG1 may be formed. Further, a second gate contact (CB2 of FIG. 7) that penetrates the first upper interlayer insulating layer 180, the upper field insulating layer 155, the upper substrate 150, the junction 140 and the lower capping pattern 113 in the vertical direction DR3 and is connected to the second lower gate electrode (BG2 of FIG. 7) may be formed. Further, a third gate contact CB3 which penetrates the upper capping pattern 163 in the vertical direction DR3 and is connected to the first upper gate electrode TG1 may be formed. Further, a fourth gate contact CB4 that penetrates the upper capping pattern 163 and the first upper interlayer insulating layer 180 in the vertical direction DR3 and is connected to the first upper gate electrode TG1 may be formed. The gate contact CB4 may be connected to the second gate contact (CB2 of FIG. 7) inside the first upper interlayer insulating layer 180.

For example, a first source/drain contact CA1 that penetrates the first upper interlayer insulating layer 180, the upper field insulating layer 155, the upper substrate 150, the junction 140, and the lower interlayer insulating layer 130 in the vertical direction DR3 and is connected to the lower source/drain region 120 may be formed. Further, a second source/drain contact CA2 that penetrates the first upper interlayer insulating layer 180 in the vertical direction DR3 and is connected to the upper source/drain region 170 may be formed.

In the process of forming the first source/drain contact CA1, the lower silicide layer 125 may be formed between the lower source/drain region 120 and the first source/drain contact CAL Further, in the process of forming the second source/drain contact CA2, the upper silicide layer 175 may be formed between the upper source/drain region 170 and the second source/drain contact CA2.

Referring to FIGS. 1 to 7, an etching stop layer 182 and a second upper interlayer insulating layer 185 may be sequentially formed on the upper surfaces of each of the first upper interlayer insulating layer 180, the first to fourth gate contacts CB1, CB2, CB3 and CB4, the first and second source/drain contacts CA1 and CA2, and the upper capping pattern 163.

The first via V1 which penetrates the second upper interlayer insulating layer 185 and the etching stop layer 182 in the vertical direction DR3 and is connected to any one of the first to fourth gate contacts CB1, CB2, CB3, and CB4 may be formed. Further, the second via V2 which penetrates the second upper interlayer insulating layer 185 and the etching stop layer 182 in the vertical direction DR3 and is connected to any one of the first and second source/drain contacts CA1 and CA2 may be formed.

According to some embodiments, by stacking the upper semiconductor element, including the upper gate electrodes TG1 and TG2, on the lower semiconductor element, including the lower gate electrodes BG1 and BG2, the degree of integration of the semiconductor device may be improved. In the semiconductor device according to some embodiments, the upper semiconductor element is bonded to the upper substrate 150 using the junction 140 disposed on the lower semiconductor element, and the upper semiconductor element is formed on the upper substrate 150. Accordingly, it is possible to realize the upper semiconductor element stacked on the lower semiconductor element. Further, the semiconductor device according to some embodiments may reduce the process difficulty, by forming a gate contact and a source/drain contact connected to the lower semiconductor element after the upper semiconductor element is formed.

Hereinafter, a semiconductor device according to some other embodiments will be described referring to FIG. 24. Differences from the semiconductor devices shown in FIGS. 1 to 7 will be mainly described.

Figure 24:
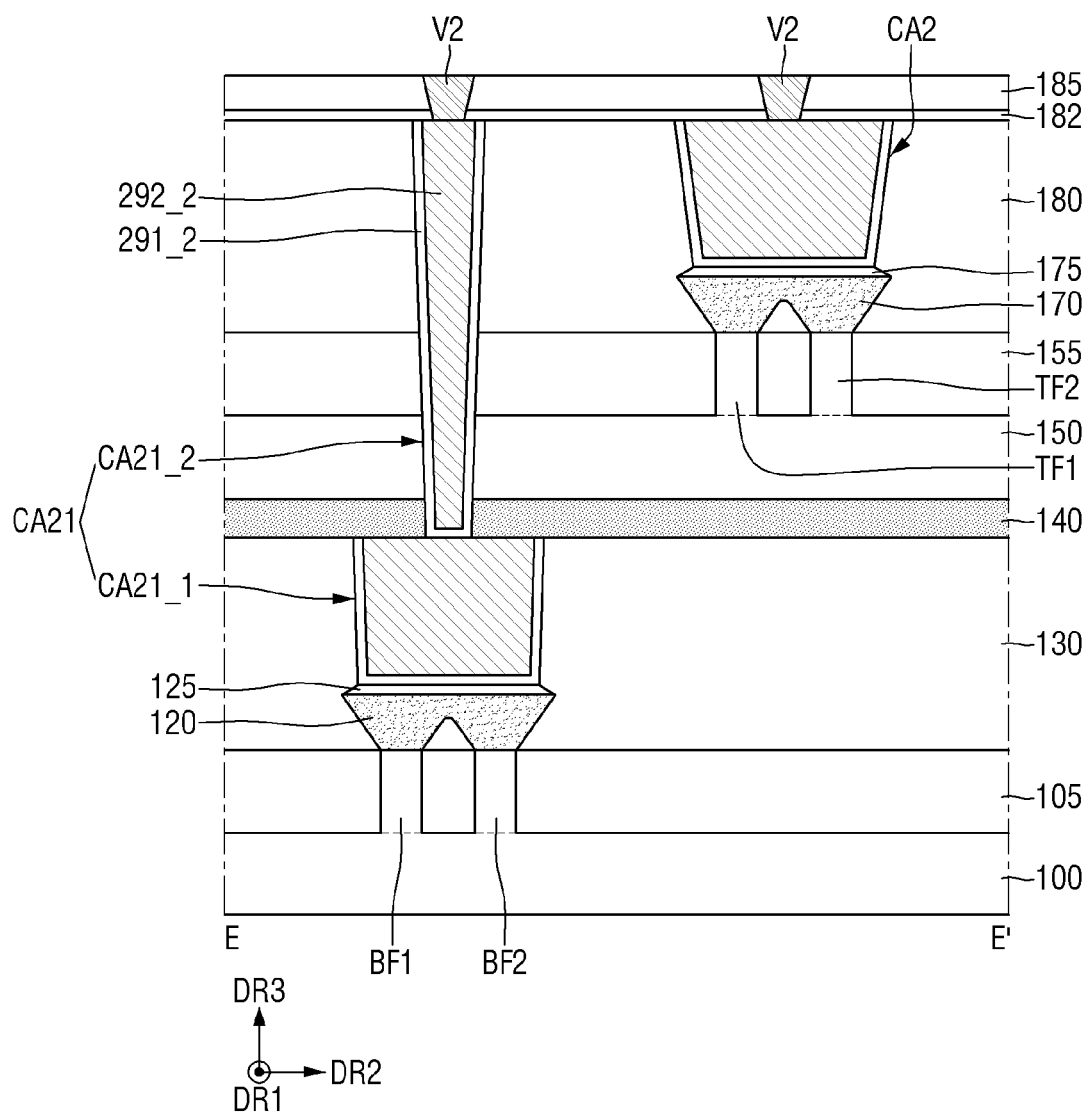
FIG. 24 is a cross-sectional view for explaining a semiconductor device according to some other embodiments.

FIG. 24 is a cross-sectional view for explaining a semiconductor device according to some other embodiments.

Referring to FIG. 24, in the semiconductor device according to some other embodiments, a first source/drain contact CA21 may include a first portion CA21_1 and a second portion CA21_2 having different widths from each other in the second horizontal direction DR2.

For example, the first portion CA21_1 of the first source/drain contact CA21 may be disposed between the lower source/drain region 120 and the junction 140. The first portion CA21_1 of the first source/drain contact CA21 may be connected to the lower source/drain region 120 through the lower silicide layer 125. An upper surface of the first portion CA21_1 of the first source/drain contact CA21 may be in contact with the junction 140. The side walls of the first portion CA21_1 of the first source/drain contact CA21 may be surrounded by the lower interlayer insulating layer 130. The upper surface of the first portion CA21_1 of the first source/drain contact CA21 may be formed on the same plane as the upper surface of the lower interlayer insulating layer 130.

The second portion CA21_2 of the first source/drain contact CA21 may be disposed on the first portion CA21_1 of the first source/drain contact CA21. The second portion CA21_2 of the first source/drain contact CA21 may penetrate the first upper interlayer insulating layer 180, the upper field insulating layer 155, the upper substrate 150 and the junction 140 in the vertical direction DR3, and may be connected to the first portion CA211 of the first source/drain contact CA21. A width in the second horizontal direction DR2 of the second portion CA21_2 of the first source/drain contact CA21 may be smaller than a width in the second horizontal direction DR2 of the first portion CA21_1 of the first source/drain contact CA21.

The first source/drain contact CA21 may include a second barrier layer 291_2 and a second filling layer 292_2. The second barrier layer 291_2 may form the side walls and bottom surface of the first portion CA21_1 of the first source/drain contact CA21. Further, the second barrier layer 291_2 may form the side walls and the bottom surface of the second portion CA21_2 of the first source/drain contact CA21.

The second filling layer 292_2 may be disposed on the second barrier layer 291_2 of the first portion CA21_1 of the first source/drain contact CA21. The upper surface of the second filling layer 292_2 of the first portion CA21_1 of the first source/drain contact CA21 may be formed on the same plane as the upper surface of the lower interlayer insulating layer 130. Further, the second filling layer 292_2 may be disposed on the second barrier layer 291_2 of the second portion CA21_2 of the first source/drain contact CA21. The upper surface of the second filling layer 292_2 of the second portion CA21_2 of the first source/drain contact CA21 may be formed on the same plane as the upper surface of the first upper interlayer insulating layer 180.

Hereinafter, a semiconductor device according to still some other embodiments will be described referring to FIGS. 25 and 26. Differences from the semiconductor device shown in FIGS. 1 to 7 will be mainly described.

Figure 25:
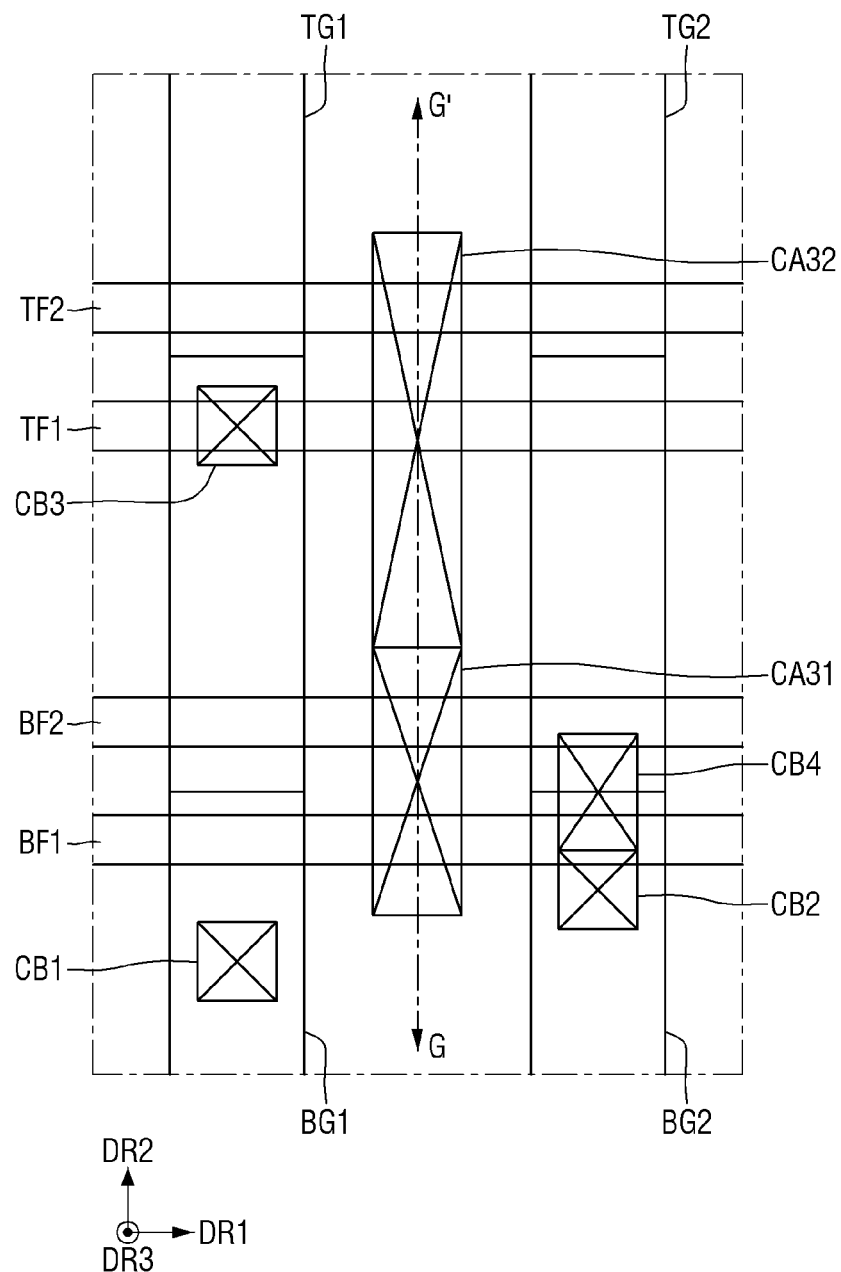
FIG. 25 is a layout diagram for explaining a semiconductor device according to still some other embodiments.

FIG. 25 is a layout diagram for explaining a semiconductor device according to still some other embodiments. FIG. 26 is a cross-sectional view taken along a line G-G' of FIG. 25.

Figure 26:
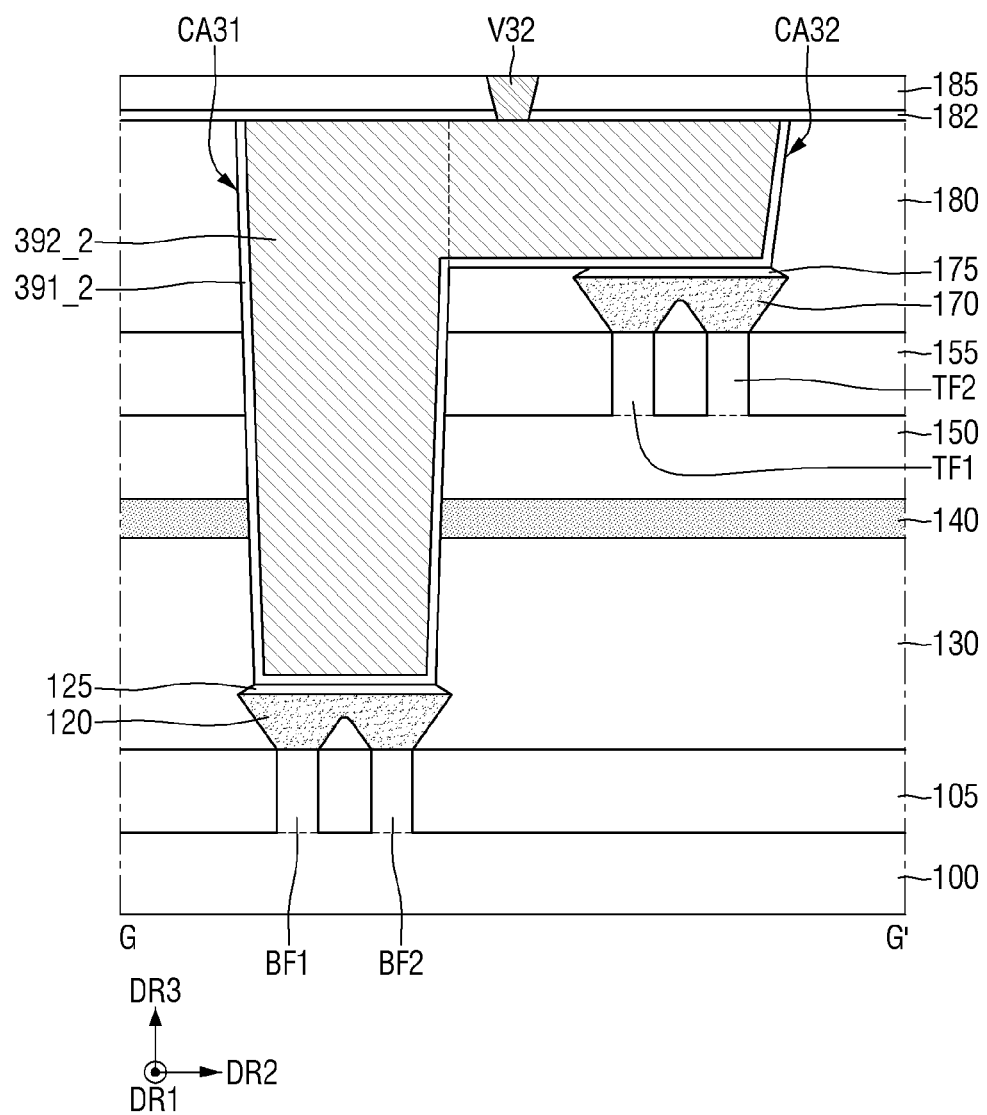
FIG. 26 is a cross-sectional view taken along a line G-G' of FIG. 25.

Referring to FIGS. 25 and 26, in the semiconductor device according to some other embodiments, a first source/drain contact CA31 and a second source/drain contact CA32 may be connected.

For example, the second source/drain contact CA32 may extend toward the first source/drain contact CA31 in the second horizontal direction DR2, and may be connected to the first source/drain contact CA31. That is, the second source/drain contact CA32 may be in contact with the first source/drain contact CA31. Each of the first and second source/drain contacts CA31 and CA32 may include a second barrier layer 391_2 and a second filling layer 392_2.

The second barrier layer 391_2 may form the side walls and bottom surfaces of each of the first and second source/drain contacts CA31 and CA32. However, the second barrier layer 391_2 may not be disposed at the portion in which the first source/drain contact CA31 and the second source/drain contact CA32 may be in contact with each other. The second filling layer 392_2 may be disposed on the second barrier layer 391_2 of each of the first and second source/drain contacts CA31 and CA32. The second filling layer 392_2 of the first source/drain contact CA31 may be in contact with the second filling layer 392_2 of the second source/drain contact CA32. The upper surfaces of the second barrier layers 391_2 of each of the first and second source/drain contacts CA31 and CA32 may be formed on the same plane as the upper surface of the first upper interlayer insulating layer 180.

The second via V32 may penetrate the second upper interlayer insulating layer 185 and the etching stop layer 182 in the vertical direction DR3, and may be connected to any one of the first and second source/drain contacts CA31 and CA32. For example, the second via V32 may penetrate the second upper interlayer insulating layer 185 and the etching stop layer 182 in the vertical direction DR3, and may be connected to the second source/drain contact CA32.

Hereinafter, a semiconductor device according to some other embodiments will be described referring to FIGS. 27 to 29. Differences from the semiconductor device shown in FIGS. 1 to 7 will be mainly described.

Figure 27:
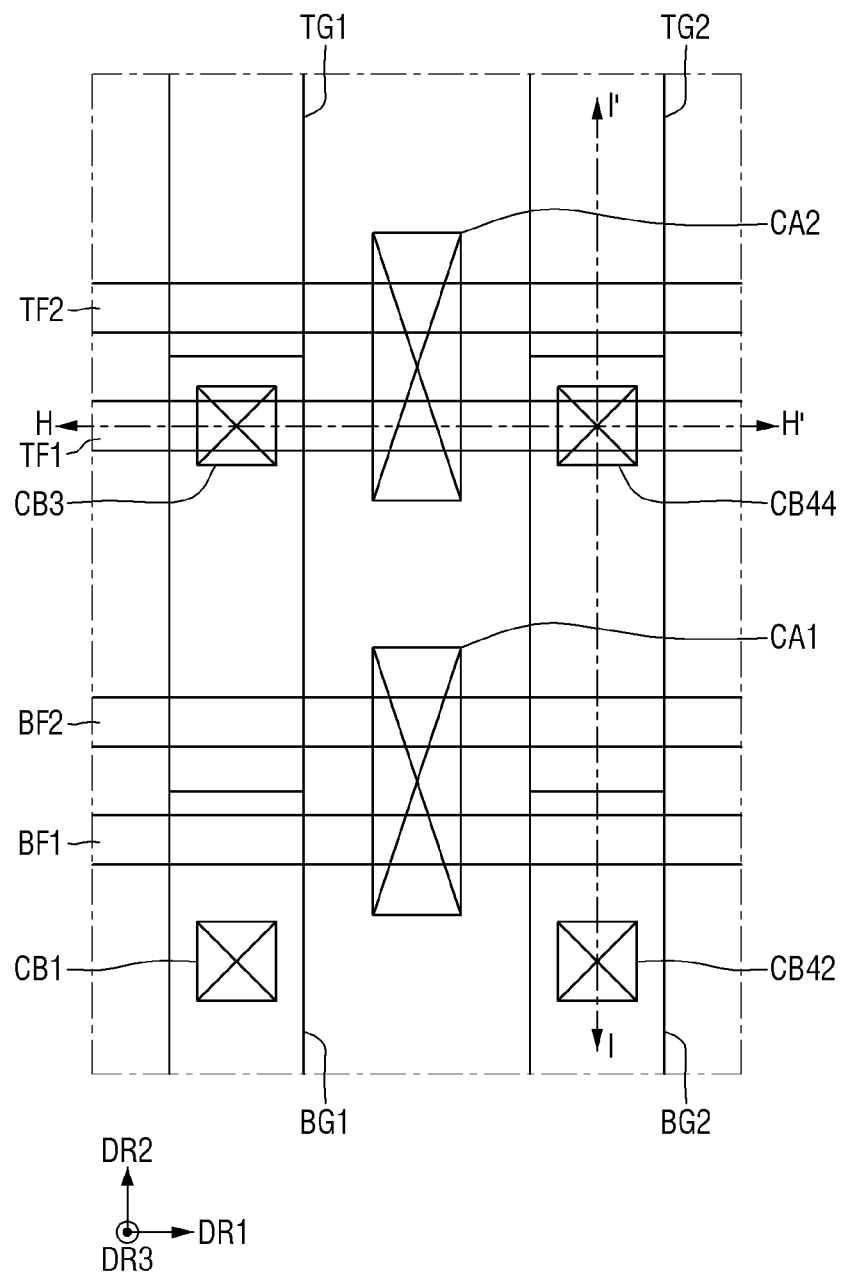
FIG. 27 is a layout diagram for explaining a semiconductor device according to still some other embodiments.

FIG. 27 is a layout diagram for explaining a semiconductor device according to still some other embodiments. FIG. 28 is a cross-sectional view taken along a line H-H' of FIG. 27. FIG. 29 is a cross-sectional view taken along a line IT of FIG. 27.

Figure 28:
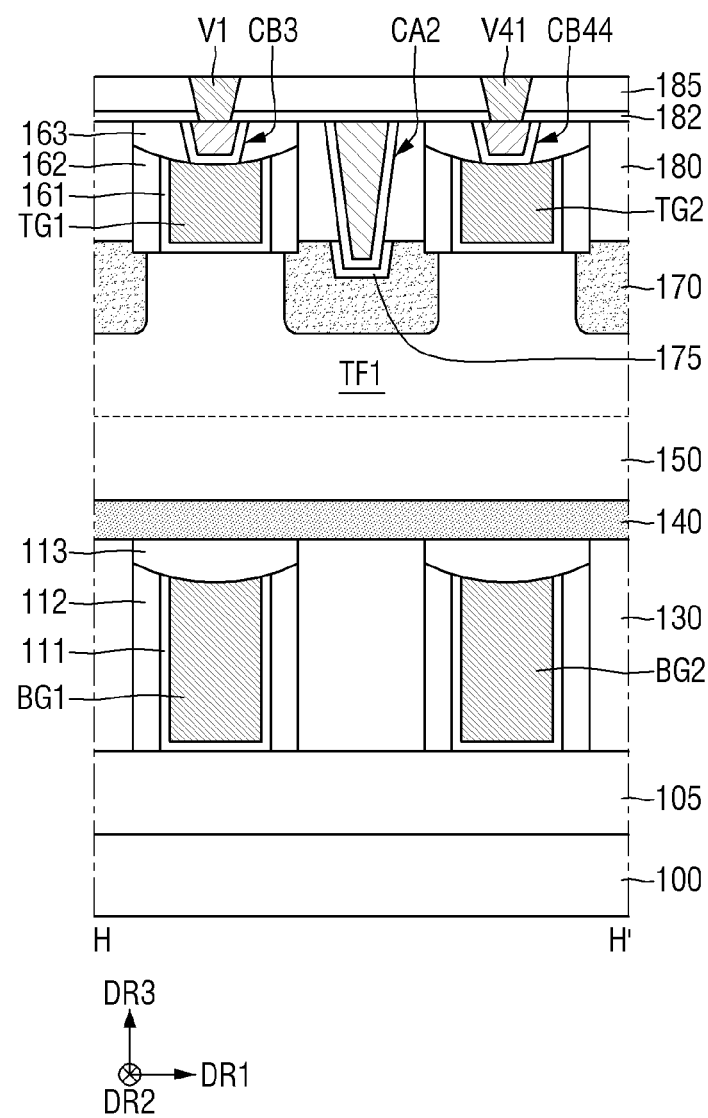
FIG. 28 is a cross-sectional view taken along a line H-H' of FIG. 27.
Figure 29:
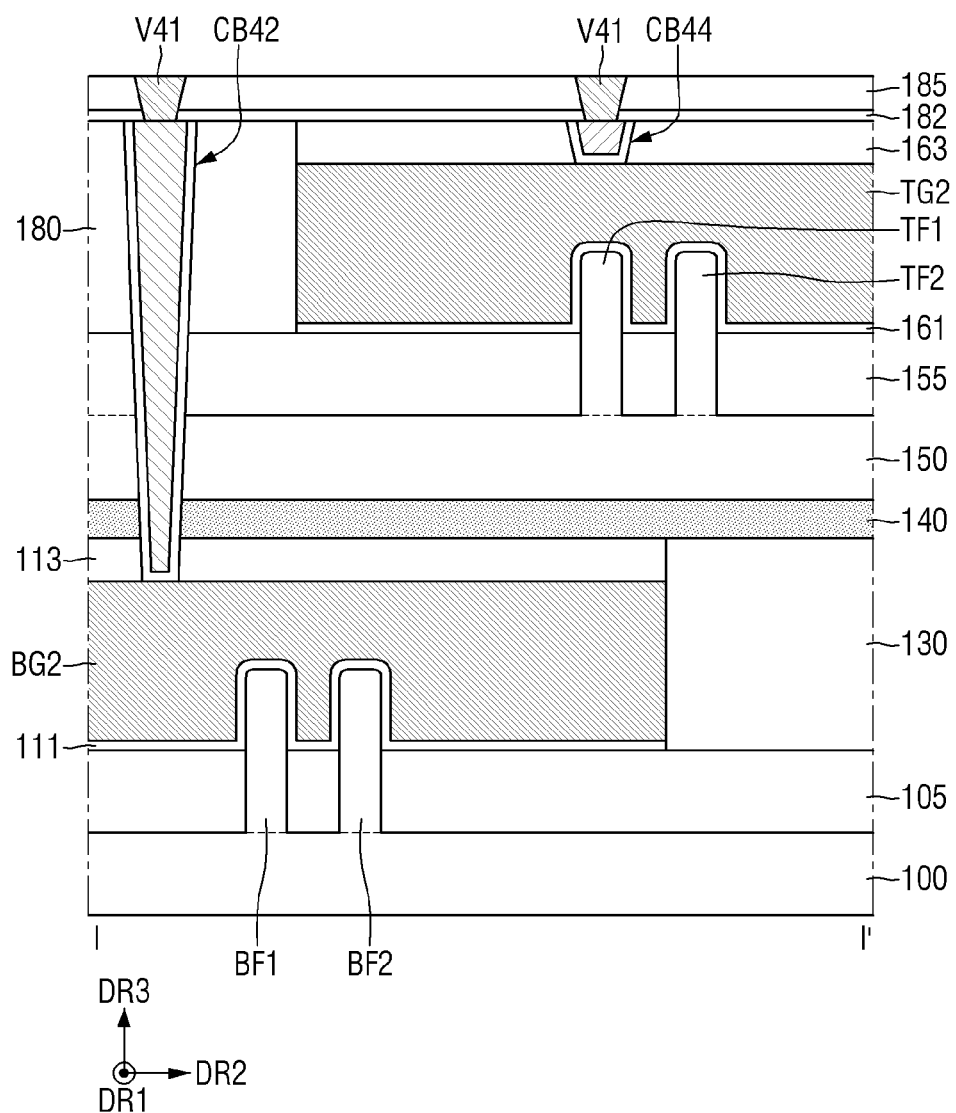
FIG. 29 is a cross-sectional view taken along a line I-I' of FIG. 27.

Referring to FIGS. 27 to 29, in a semiconductor device according to still some other embodiments, a fourth gate contact CB44 may be spaced apart from the second gate contact CB42 in the second horizontal direction DR2.

For example, the second gate contact CB42 may be disposed on the second lower gate electrode BG2. The second gate contact CB42 may be spaced apart from the second upper gate electrode TG2 in the second horizontal direction DR2. The second gate contact CB42 may penetrate the first upper interlayer insulating layer 180, the upper field insulating layer 155, the upper substrate 150, the junction 140, and the lower capping pattern 113 in the vertical direction DR3, and may be connected to the second lower gate electrode BG2.

The fourth gate contact CB44 may be disposed on the second upper gate electrode TG2. The fourth gate contact CB44 may be spaced apart from the second gate contact CB42 in the second horizontal direction DR2. The fourth gate contact CB44 may penetrate the upper capping pattern 163 in the vertical direction DR3, and may be connected to the second upper gate electrode TG2. Although FIG. 29 shows that the fourth gate contact CB44 overlaps each of the second lower gate electrode BG2 and the first upper active pattern TF1 in the vertical direction DR3, this is an example, and embodiments are not limited thereto.

A first via V41 may penetrate the second upper interlayer insulating layer 185 and the etching stop layer 182 in the vertical direction DR3, and may be connected to any one of the second and fourth gate contacts CB42 and CB44.

Hereinafter, a semiconductor device according to some other embodiments will be described referring to FIGS. 30 to 32. Differences from the semiconductor device shown in FIGS. 1 to 7 will be mainly described.

Figure 30:
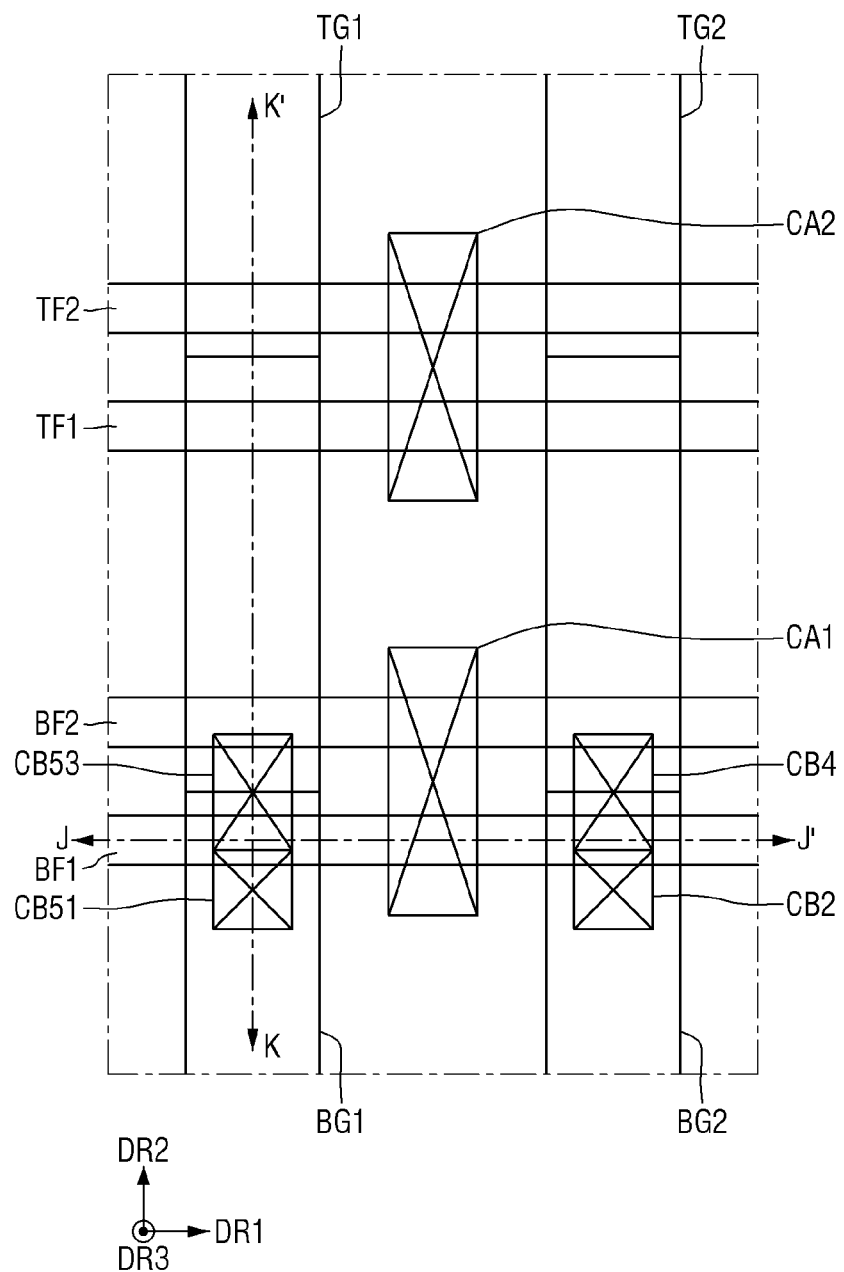
FIG. 30 is a layout diagram for explaining a semiconductor device according to still some other embodiments.

FIG. 30 is a layout diagram for explaining a semiconductor device according to still some other embodiments. FIG. 31 is a cross-sectional view taken along a line J-J' of FIG. 30. FIG. 32 is a cross-sectional view taken along a line K-K' of FIG. 30.

Figure 31:
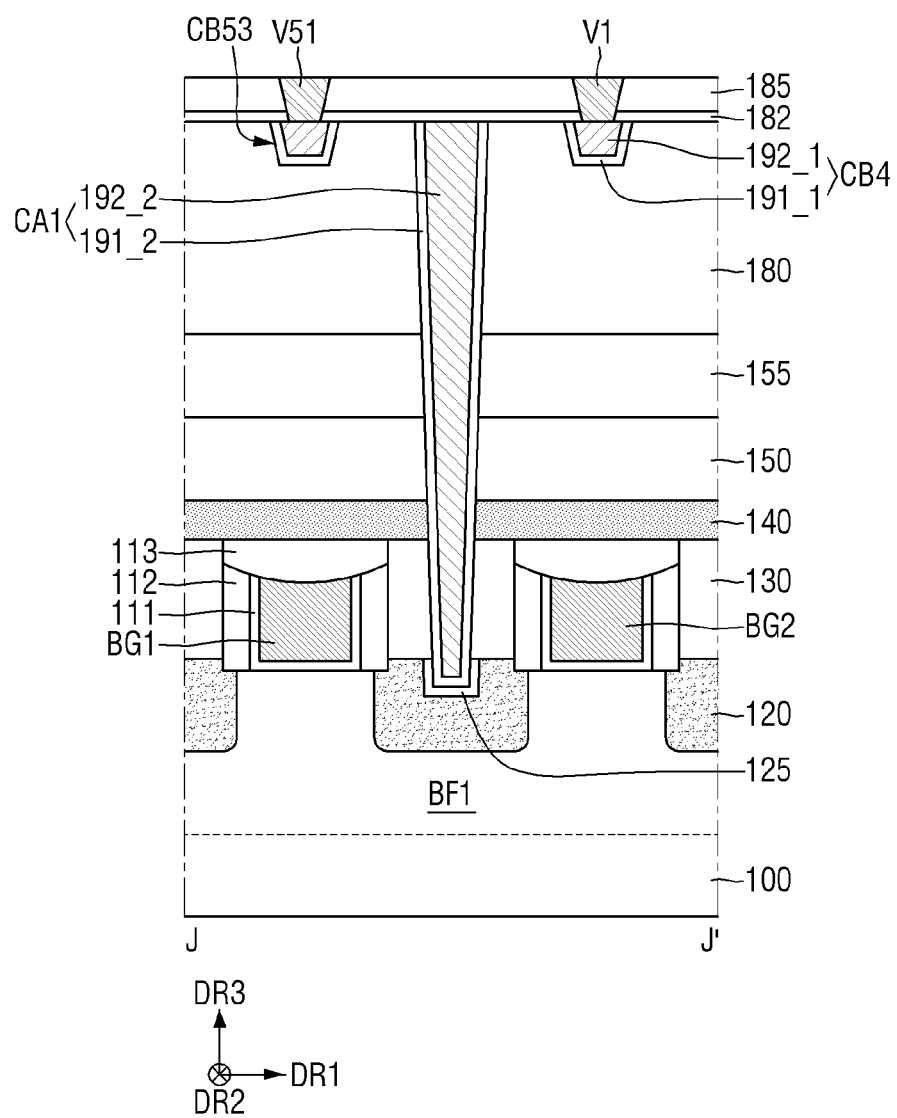
FIG. 31 is a cross-sectional view taken along a line J-J' of FIG. 30.
Figure 32:
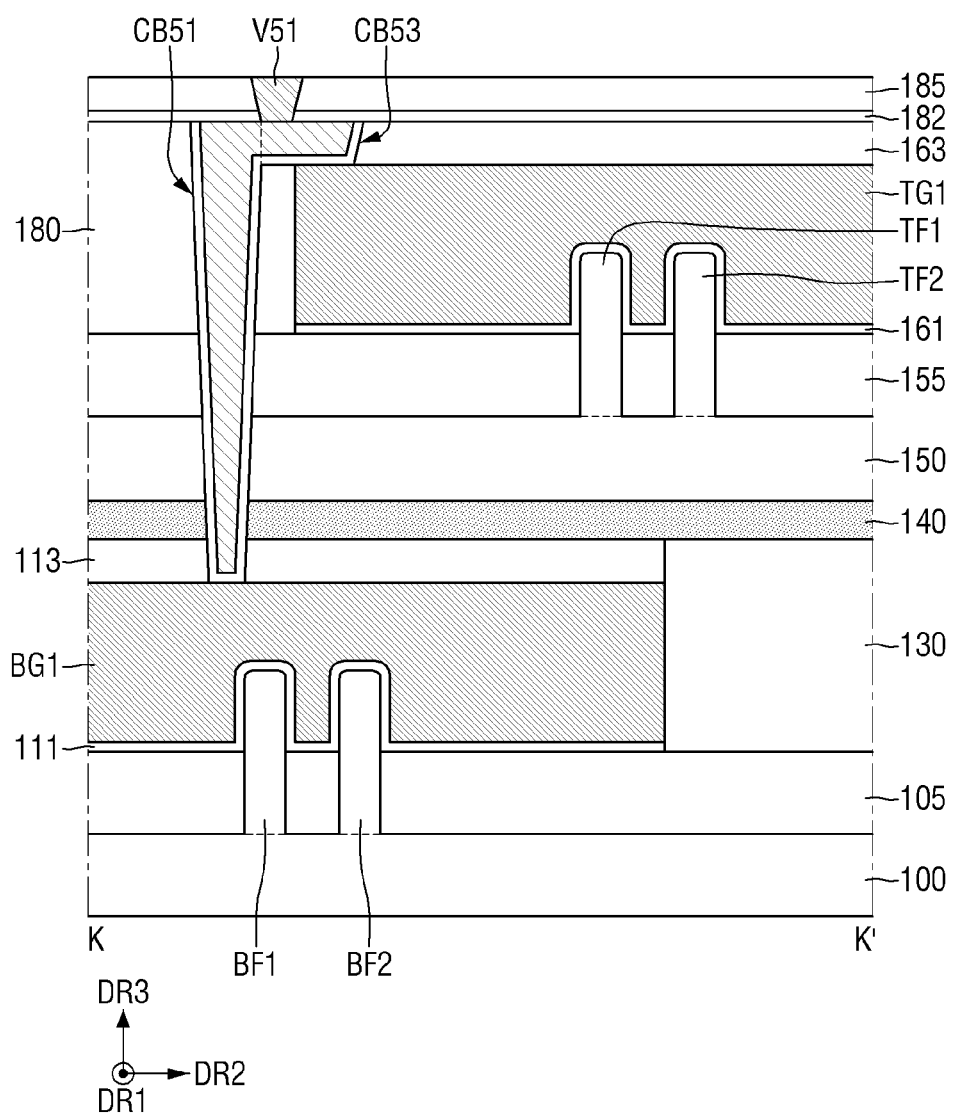
FIG. 32 is a cross-sectional view taken along a line K-K' of FIG. 30.

Referring to FIGS. 30 to 32, in the semiconductor device according to still some other embodiments, a third gate contact CB53 may be in contact with a first gate contact CB51.

For example, the first gate contact CB51 may be disposed on the first lower gate electrode BG1. The first gate contact CB51 may be spaced apart from the first upper gate electrode TG1 in the second horizontal direction DR2. The first gate contact CB51 may penetrate the first upper interlayer insulating layer 180, the upper field insulating layer 155, the upper substrate 150, the junction 140, and the lower capping pattern 113 in the vertical direction DR3, and may be connected to the first lower gate electrode BG1.

A third gate contact CB53 may be disposed on the first upper gate electrode TG1. The third gate contact CB53 may be in contact with the first gate contact CB51. The third gate contact CB53 may penetrate the upper capping pattern 163 and the first upper interlayer insulating layer 180 in the vertical direction DR3, and may be connected to the first upper gate electrode TG1. For example, a lower surface of a part of the third gate contact CB53 may be in contact with the first upper gate electrode TG1, and a lower surface of the remaining part of the third gate contact CB53 may be in contact with the first upper interlayer insulating layer 180.

A first via V51 may penetrate the second upper interlayer insulating layer 185 and the etching stop layer 182 in the vertical direction DR3, and may be connected to any one of the first and third gate contacts CB51 and CB53. Although FIG. 32 shows that the first via V51 is connected to the third gate contact CB53, this is an example, and embodiments are not limited thereto. In some other embodiments, the first via V51 may be connected to the first gate contact CB51.

Hereinafter, a semiconductor device according to some other embodiments will be described referring to FIGS. 33 to 36. Differences from the semiconductor device shown in FIGS. 1 to 7 will be mainly described.

Figure 33:
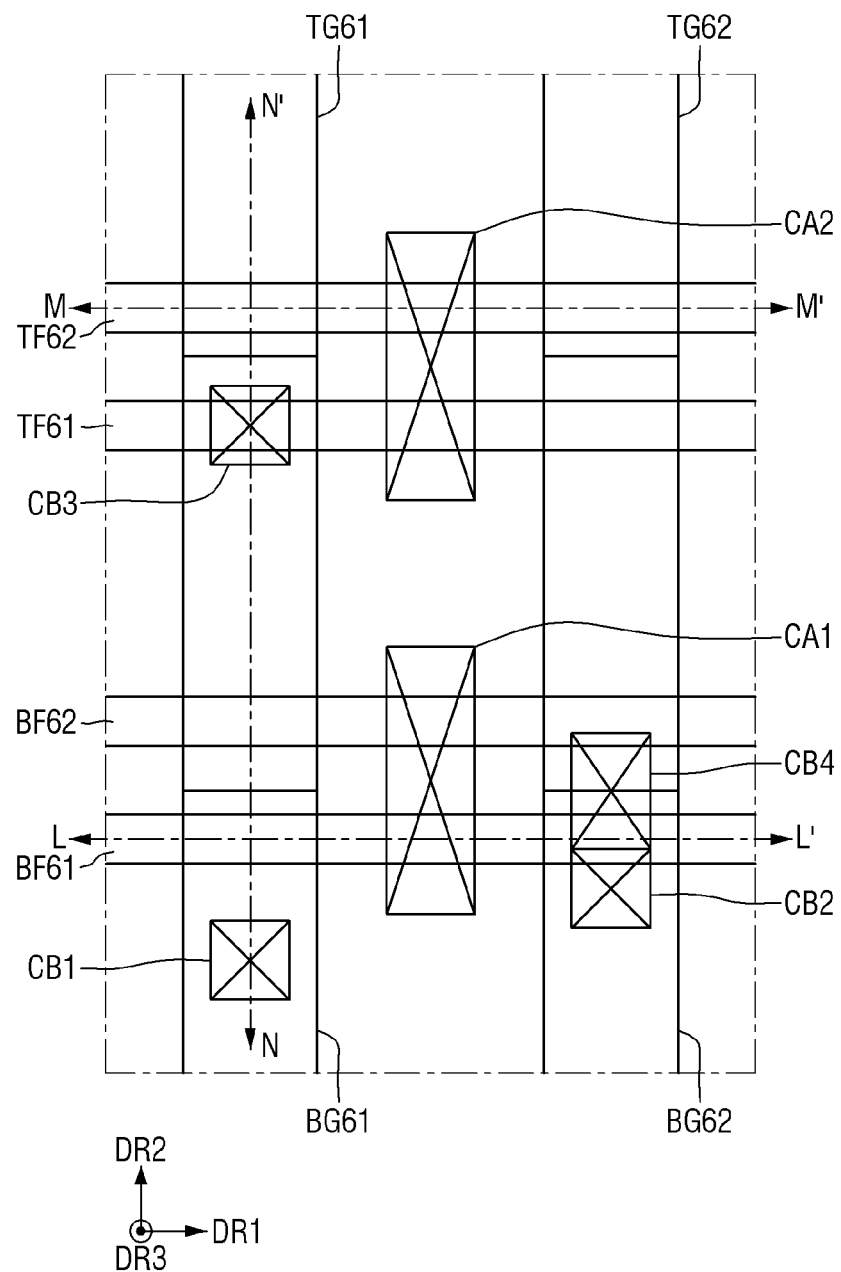
FIG. 33 is a layout diagram for explaining a semiconductor device according to still some other embodiments.
Figure 34:
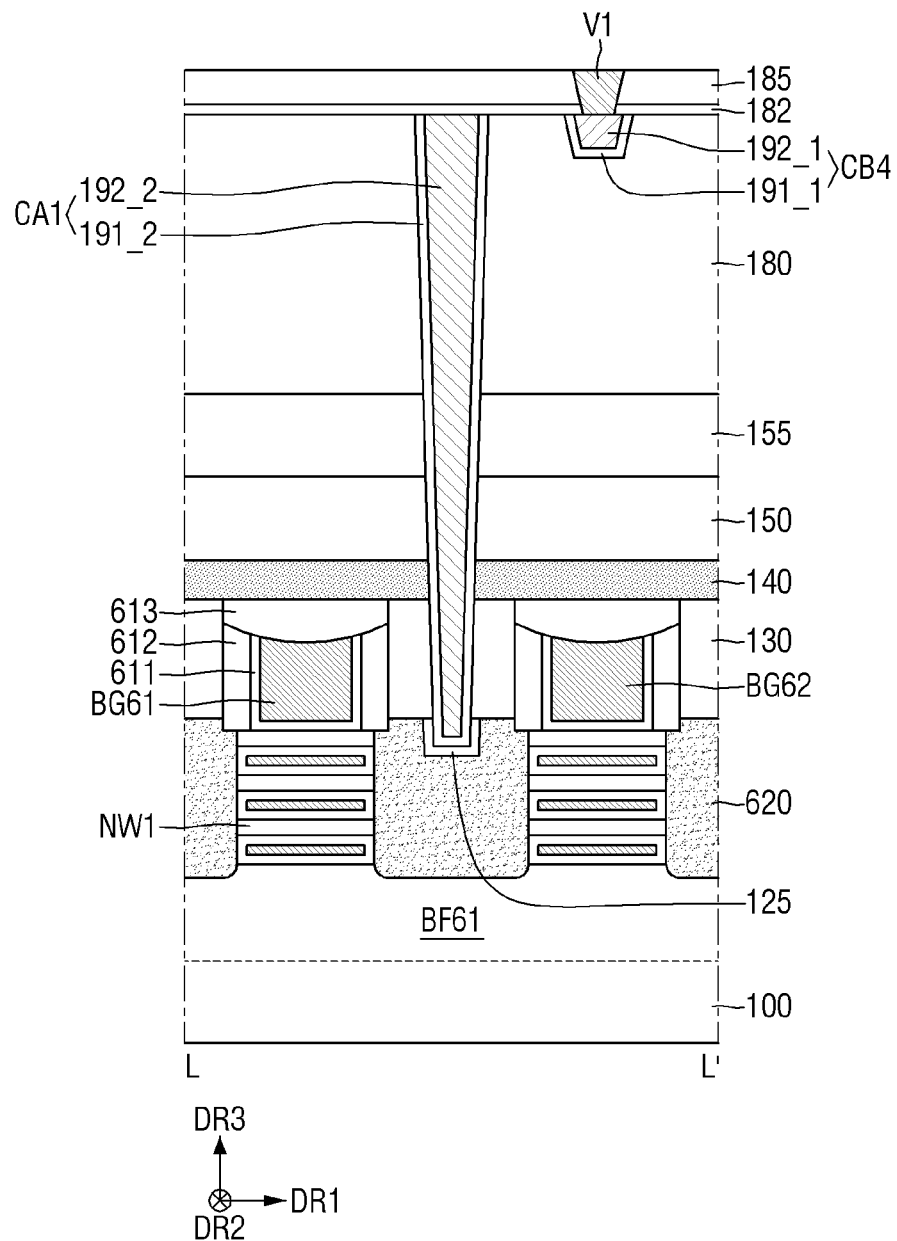
FIG. 34 is a cross-sectional view taken along a line L-L' of FIG. 33.
Figure 35:
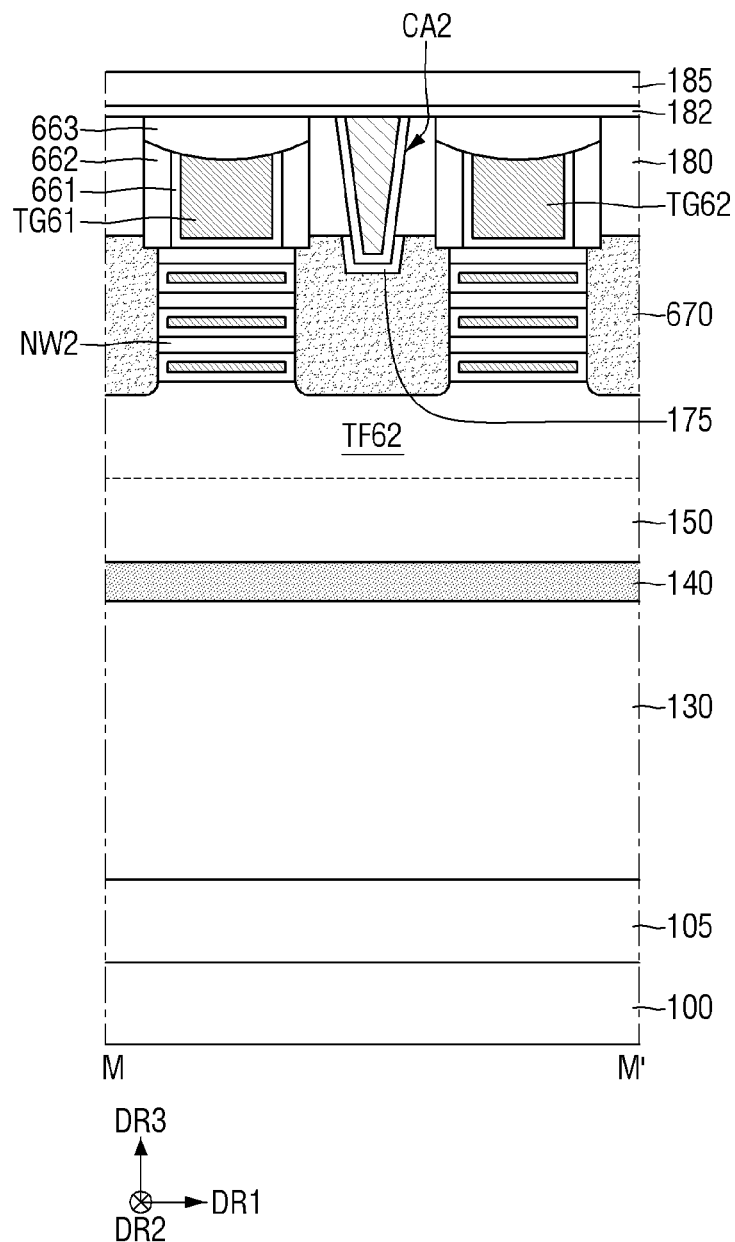
FIG. 35 is a cross-sectional view taken along a line M-M' of FIG. 33.
Figure 36:
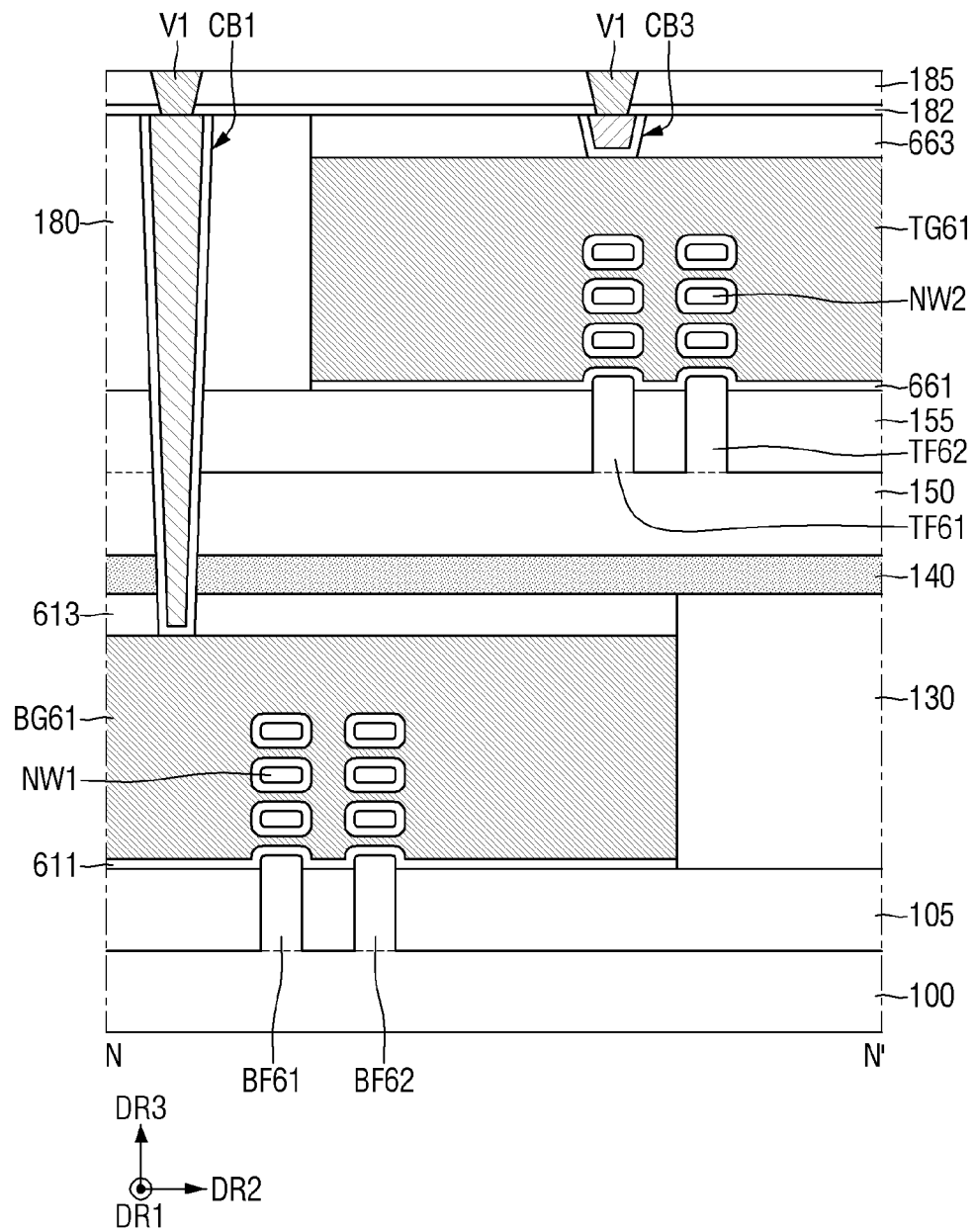
FIG. 36 is a cross-sectional view taken along a line N-N' of FIG. 33.

FIG. 33 is a layout diagram for explaining a semiconductor device according to still some other embodiments. FIG. 34 is a cross-sectional view taken along a line L-L' of FIG. 33. FIG. 35 is a cross-sectional view taken along a line M-M' of FIG. 33. FIG. 36 is a cross-sectional view taken along a line N-N' of FIG. 33.

Referring to FIGS. 33 to 36, a semiconductor device according to still some other embodiments may include an MBCFET™ including a plurality of lower nanosheets NW1 and a plurality of upper nanosheets NW2. For example, a semiconductor device according to still some other embodiments includes first and second lower active patterns BF61 and BF62, a plurality of lower nanosheets NW1, first and second lower gate electrodes BG61 and BG62, a lower gate insulating layer 611, a lower gate spacer 612, a lower capping pattern 613, a lower source/drain region 620, first and second upper active patterns TF61 and TF62, a plurality of upper nanosheets NW2, first and second upper gate electrodes TG61 and TG62, an upper gate insulating layer 661, an upper gate spacer 662, an upper capping pattern 663, and an upper source/drain region 670.

Each of the first and second lower active patterns BF61 and BF62 may protrude from the lower substrate 100 in the vertical direction DR3. Each of the first and second lower active patterns BF61 and BF62 may extend in the first horizontal direction DR1. The second lower active pattern BF62 may be spaced apart from the first lower active pattern BF61 in the second horizontal direction DR2. The plurality of lower nanosheets NW1 may be disposed on each of the first and second lower active patterns BF61 and BF62. The plurality of lower nanosheets NW1 may include a plurality of nanosheets stacked to be spaced apart from each other in the vertical direction DR3. The plurality of lower nanosheets NW1 disposed on the second lower active pattern BF62 may be spaced apart from the plurality of lower nanosheets NW1 disposed on the first lower active pattern BF61 in the second horizontal direction DR2.

Each of the first and second lower gate electrodes BG61 and BG62 may extend in the second horizontal direction DR2 on the first and second lower active patterns BF61 and BF62. The second lower gate electrode BG62 may be spaced apart from the first lower gate electrode BG61 in the first horizontal direction DR1. Each of the first and second lower gate electrodes BG61 and BG62 may surround a plurality of lower nanosheets NW1. The plurality of lower nanosheets NW1 surrounded by the second lower gate electrode BG62 may be spaced apart from the plurality of lower nanosheets NW1 surrounded by the first lower gate electrode BG61 in the first horizontal direction DR1.

The lower source/drain region 620 may be disposed on at least one side of each of the first and second lower gate electrodes BG61 and BG62 on the first and second lower active patterns BF61 and BF62. The lower source/drain region 620 may be in contact with the plurality of lower nanosheets NW1.

The lower gate spacer 612 may extend in the second horizontal direction DR2 along the side walls of each of the first and second lower gate electrodes BG61 and BG62 on the uppermost nanosheets of the plurality of lower nanosheets NW1. Further, the lower gate spacer 612 may extend in the second horizontal direction DR2 along the side walls of each of the first and second lower gate electrodes BG61 and BG62 on the lower field insulating layer 105.

The lower gate insulating layer 611 may be disposed between each of the first and second lower gate electrodes BG61 and BG62 and the plurality of lower nanosheets NW1. The lower gate insulating layer 611 may be disposed between each of the first and second lower gate electrodes BG61 and BG62 and the lower gate spacer 612. The lower gate insulating layer 611 may be disposed between each of the first and second lower gate electrodes BG61 and BG62 and the lower source/drain region 620. The lower gate insulating layer 611 may be disposed between each of the first and second lower gate electrodes BG61 and BG62 and each of the first and second lower active patterns BF61 and BF62. The lower gate insulating layer 611 may be disposed between each of the first and second lower gate electrodes BG61 and BG62 and the lower field insulating layer 105.

Although FIG. 34 shows that the lower gate insulating layer 611 is in contact with the lower source/drain region 620, embodiments are not limited thereto. In some other embodiments, an internal spacer may be disposed between the lower gate insulating layer 611 and the lower source/drain region 620. The lower capping pattern 613 may be disposed on each of the first and second lower gate electrodes BG61 and BG62.

Each of the first and second upper active patterns TF61 and TF62 may protrude from the upper substrate 150 in the vertical direction DR3. Each of the first and second upper active patterns TF61 and TF62 may extend in the first horizontal direction DR1. The second upper active pattern BF62 may be spaced apart from the first upper active pattern BF61 in the second horizontal direction DR2. The plurality of upper nanosheets NW2 may be disposed on each of the first and second upper active patterns TF61 and TF62. The plurality of upper nanosheets NW2 may include a plurality of nanosheets stacked to be spaced apart from each other in the vertical direction DR3. The plurality of upper nanosheets NW2 disposed on the second upper active pattern TF62 may be spaced apart from the plurality of upper nanosheets NW2 disposed on the first upper active pattern TF61 and the second horizontal direction DR2.

Each of the first and second upper gate electrodes TG61 and TG62 may extend in the second horizontal direction DR2 on the first and second upper active patterns TF61 and TF62. The second upper gate electrode TG62 may be spaced apart from the first upper gate electrode TG61 in the first horizontal direction DR1. Each of the first and second upper gate electrodes TG61 and TG62 may surround a plurality of upper nanosheets NW2. The plurality of upper nanosheets NW2 surrounded by the second upper gate electrode TG62 may be spaced apart from the plurality of upper nanosheets NW2 surrounded by the first upper gate electrode TG61 in the first horizontal direction DR1.

The upper source/drain region 670 may be disposed on at least one side of each of the first and second upper gate electrodes TG61 and TG62 on the first and second upper active patterns TF61 and TF62. The upper source/drain region 670 may be in contact with a plurality of upper nanosheets NW2.

The upper gate spacer 662 may extend in the second horizontal direction DR2 along the side walls of each of the first and second upper gate electrodes TG61 and TG62 on the uppermost nanosheets of the plurality of upper nanosheets NW2. Further, the upper gate spacer 662 may extend in the second horizontal direction DR2 along the side walls of each of the first and second upper gate electrodes TG61 and TG62 on the upper field insulating layer 155.

The upper gate insulating layer 661 may be disposed between each of the first and second upper gate electrodes TG61 and TG62 and the plurality of upper nanosheets NW2. The upper gate insulating layer 661 may be disposed between each of the first and second upper gate electrodes TG61 and TG62 and the upper gate spacer 662. The upper gate insulating layer 661 may be disposed between each of the first and second upper gate electrodes TG61 and TG62 and the upper source/drain region 670. The upper gate insulating layer 661 may be disposed between each of the first and second upper gate electrodes TG61 and TG62 and each of the first and second upper active patterns TF61 and TF62. The upper gate insulating layer 661 may be disposed between each of the first and second upper gate electrodes TG61 and TG62 and the upper field insulating layer 155.

Although FIG. 35 shows that the upper gate insulating layer 661 is in contact with the upper source/drain region 670, embodiments are not limited thereto. In some other embodiments, an internal spacer may be disposed between the upper gate insulating layer 661 and the upper source/ drain region 670. The upper capping pattern 663 may be disposed on each of the first and second upper gate electrodes TG61 and TG62.

Although FIGS. 33 to 36 show that both the lower semiconductor element including the lower gate electrodes BG61 and BG62 and the lower semiconductor element including the upper gate electrodes TG61 and TG62 have an MBCFET™ structure, embodiments are not limited thereto.

In some other embodiments, the lower semiconductor element including the lower gate electrodes (BG1 and BG2 of FIG. 2) may have a FinFET structure shown in FIGS. 1 to 7, and the upper semiconductor element including the upper gate electrodes TG61 and TG62 may have an MBCFET™ structure.

In some other embodiments, the lower semiconductor element including the lower gate electrodes BG61 and BG62 may have an MBCFET™ structure, and the upper semiconductor element including the upper gate electrodes (TG1 and TG2 of FIG. 4) may have the FinFET structure shown in FIGS. 1 to 7.

While aspects of example embodiments have been particularly shown and described, it will be understood that various changes in form and details may be made therein without departing from the spirit and scope of the following claims.

What is claimed is:

1. A semiconductor device comprising:
   a lower substrate;
   a lower active pattern which extends in a first horizontal direction on the lower substrate;
   a first lower gate electrode which extends in a second horizontal direction which crosses the first horizontal direction on the lower active pattern;
   a junction on the first lower gate electrode;
   an upper substrate on the junction;
   an upper active pattern which extends in the first horizontal direction on the upper substrate, wherein the upper active pattern is spaced apart from the lower active pattern in each of the second horizontal direction and a vertical direction which crosses the first horizontal direction and the second horizontal direction, and wherein the upper active pattern does not overlap with the lower active pattern in the vertical direction;
   a first upper gate electrode which extends in the second horizontal direction on the upper active pattern, wherein the first upper gate electrode at least partially overlaps the first lower gate electrode in the vertical direction; and
   a first gate contact which is spaced apart from the first upper gate electrode in the second horizontal direction, wherein the first gate contact extends through the upper substrate and the junction in the vertical direction, the first gate contact is connected to the first lower gate electrode, and the first gate contact has an upper surface that is farther from the lower substrate than an upper surface of the first upper gate electrode.

2. The semiconductor device of claim 1, further comprising:
   a second lower gate electrode which extends in the second horizontal direction on the lower active pattern, wherein the second lower gate electrode is spaced apart from the first lower gate electrode in the first horizontal direction; and
   a second upper gate electrode which extends in the second horizontal direction on the upper active pattern, wherein the second upper gate electrode is spaced apart from the first upper gate electrode in the first horizontal direction, and the second upper gate electrode at least partially overlaps the second lower gate electrode in the vertical direction.

3. The semiconductor device of claim 2, further comprising:
   a second gate contact which is spaced apart from the second upper gate electrode in the second horizontal direction, wherein the second gate contact extends through the upper substrate and the junction in the vertical direction, the second gate contact is connected to the second lower gate electrode, and the second gate contact has an upper surface that is farther from the lower substrate than an upper surface of the second upper gate electrode; and
   a third gate contact which is in contact with the second gate contact and is connected to the second upper gate electrode, wherein an upper surface of the third gate contact and the upper surface of the second gate contact extend along a common plane.

4. The semiconductor device of claim 3, further comprising a capping pattern on the second upper gate electrode, wherein an upper surface of the capping pattern extends along the common plane.

5. The semiconductor device of claim 1, further comprising:
   a lower source/drain region on at least one side of the first lower gate electrode on the lower active pattern; and
   an upper source/drain region on at least one side of the first upper gate electrode on the upper active pattern, wherein the upper source/drain region is spaced apart from the lower source/drain region in each of the second horizontal direction and the vertical direction.

6. The semiconductor device of claim 5, further comprising:
   a first source/drain contact which extends in the second horizontal direction, and through the upper substrate and the junction in the vertical direction, wherein the first source/drain contact is connected to the lower source/drain region; and
   a second source/drain contact which extends in the second horizontal direction and is connected to the upper source/drain region, wherein an upper surface of the second source/drain contact and an upper surface of the first source/drain contact extend along a common plane.

7. The semiconductor device of claim 6, wherein the first source/drain contact comprises:
   a first portion between the lower source/drain region and the junction; and
   a second portion on the first portion which extends through the upper substrate and the junction in the vertical direction and is connected to the first portion, and
   wherein the second portion, in the second horizontal direction, is narrower than the first portion.

8. The semiconductor device of claim 5, further comprising:
   a first source/drain contact which extends in the second horizontal direction, and through the upper substrate and the junction in the vertical direction, wherein the first source/drain contact is connected to the lower source/drain region; and
   a second source/drain contact which extends in the second horizontal direction, wherein the second source/drain contact is connected to the upper source/drain region, the second source/drain contact is in contact with the first source/drain contact, and an upper surface of the second source/drain contact and an upper surface of the first source/drain contact extend along a common plane.

9. The semiconductor device of claim 1, further comprising:
a lower interlayer insulating layer on side walls of the first lower gate electrode between the lower substrate and the junction; and
an upper interlayer insulating layer on side walls of the first upper gate electrode on the upper substrate.

10. The semiconductor device of claim 1, further comprising a plurality of lower nanosheets spaced apart in the vertical direction on the lower active pattern,
wherein the first lower gate electrode is on the plurality of lower nanosheets.

11. The semiconductor device of claim 1, further comprising a plurality of upper nanosheets spaced apart in the vertical direction on the upper active pattern,
wherein the first upper gate electrode is on the plurality of upper nanosheets.

12. The semiconductor device of claim 1, wherein an upper surface of the first lower gate electrode is farther from the lower substrate than an uppermost surface of the lower active pattern, and
wherein the upper surface of the first upper gate electrode is farther from the lower substrate than an uppermost surface of the upper active pattern.

13. A semiconductor device comprising:
a lower substrate;
a lower active pattern which extends in a first horizontal direction on the lower substrate;
a first lower gate electrode which extends in a second horizontal direction which crosses the first horizontal direction on the lower active pattern;
a lower source/drain region on at least one side of the first lower gate electrode;
a lower interlayer insulating layer on side walls of the first lower gate electrode;
a junction on the lower interlayer insulating layer and the first lower gate electrode;
an upper substrate on the junction;
an upper active pattern which extends in the first horizontal direction on the upper substrate, wherein the upper active pattern does not overlap with the lower active pattern in a vertical direction which crosses the first horizontal direction and the second horizontal direction;
a first upper gate electrode which extends in the second horizontal direction on the upper active pattern, wherein the first upper gate electrode at least partially overlaps the first lower gate electrode in the vertical direction;
an upper source/drain region on at least one side of the first upper gate electrode;
an upper interlayer insulating layer on side walls of the first upper gate electrode;
a first source/drain contact which extends through the upper interlayer insulating layer, the upper substrate, the junction and the lower interlayer insulating layer in the vertical direction, and is connected to the lower source/drain region; and
a second source/drain contact which extends through the upper interlayer insulating layer in the vertical direction, and is connected to the upper source/drain region,
wherein an upper surface of the first source/drain contact and an upper surface of the second source/drain contact extend along a common plane.

14. The semiconductor device of claim 13, wherein the lower active pattern and the upper active pattern are spaced apart in each of the second horizontal direction and the vertical direction.

15. The semiconductor device of claim 13, further comprising a first gate contact which is spaced apart from the first upper gate electrode in the second horizontal direction, wherein the first gate contact extends through the upper interlayer insulating layer, the upper substrate and the junction in the vertical direction, the first gate contact is connected to the first lower gate electrode, and the first gate contact has an upper surface that is farther from the lower substrate than an upper surface of the first upper gate electrode.

16. The semiconductor device of claim 15, further comprising a second gate contact which is connected to the first upper gate electrode, wherein the second gate contact is spaced apart from the first gate contact in the second horizontal direction, and an upper surface of the second gate contact and an upper surface of the first gate contact extend along the common plane.

17. The semiconductor device of claim 13, further comprising:
a second lower gate electrode which extends in the second horizontal direction on the lower active pattern, the second lower gate electrode is spaced apart from the first lower gate electrode in the first horizontal direction; and
a second upper gate electrode which extends in the second horizontal direction on the upper active pattern, the second upper gate electrode is spaced apart from the first upper gate electrode in the first horizontal direction, the second upper gate electrode at least partially overlaps the second lower gate electrode in the vertical direction.

18. The semiconductor device of claim 17, further comprising:
a third gate contact which is spaced apart from the second upper gate electrode in the second horizontal direction, the third gate contact extends through the upper interlayer insulating layer, the upper substrate, and the junction in the vertical direction, the third gate contact is connected to the second lower gate electrode, the third gate contact has an upper surface formed that is farther from the lower substrate than an upper surface of the second upper gate electrode; and
a fourth gate contact which is in contact with the third gate contact, wherein the fourth gate contact is connected to the second upper gate electrode, and an upper surface of the fourth gate contact and an upper surface of the third gate contact extend along the common plane.

19. The semiconductor device of claim 13, wherein the first source/drain contact comprises:
a first portion which is surrounded by the lower interlayer insulating layer; and
a second portion which is surrounded by the junction, the upper substrate, and the upper interlayer insulating layer on the first portion,
wherein the second portion is connected to the first portion, and
wherein the second portion, in the second horizontal direction, is narrower than the first portion.

20. A semiconductor device comprising:
a lower substrate;
a lower active pattern which extends in a first horizontal direction on the lower substrate;

a first lower gate electrode which extends in a second horizontal direction which crosses the first horizontal direction on the lower active pattern;

a second lower gate electrode which extends in the second horizontal direction on the lower active pattern, wherein the second lower gate electrode is spaced apart from the first lower gate electrode in the first horizontal direction;

a lower source/drain region between the first lower gate electrode and the second lower gate electrode;

a lower interlayer insulating layer on side walls of each of the first and second lower gate electrodes;

a junction on the lower interlayer insulating layer and the first and second lower gate electrodes;

an upper substrate on the junction;

an upper active pattern which extends in the first horizontal direction on the upper substrate, wherein the upper active pattern does not overlap with the lower active pattern in a vertical direction which crosses the first horizontal direction and the second horizontal direction;

a first upper gate electrode which extends in the second horizontal direction on the upper active pattern, wherein the first upper gate electrode at least partially overlaps the first lower gate electrode in the vertical direction;

a second upper gate electrode which extends in the second horizontal direction on the upper active pattern, wherein the second upper gate electrode is spaced apart from the first upper gate electrode in the first horizontal direction, and the second upper gate electrode at least partially overlaps the second lower gate electrode in the vertical direction;

an upper source/drain region between the first upper gate electrode and the second upper gate electrode;

an upper interlayer insulating layer on side walls of the first and second upper gate electrodes;

a first gate contact which is spaced apart from the first upper gate electrode in the second horizontal direction, wherein the first gate contact extends through the upper interlayer insulating layer, the upper substrate and the junction in the vertical direction, the first gate contact is connected to the first lower gate electrode, and the first gate contact has an upper surface that is farther from the lower substrate than an upper surface of the first upper gate electrode;

a second gate contact which is spaced apart from the second upper gate electrode in the second horizontal direction, the second gate contact extends through the upper interlayer insulating layer, the upper substrate and the junction in the vertical direction, the second gate contact is connected to the second lower gate electrode, the second gate contact has an upper surface that is farther from the lower substrate than an upper surface of the second upper gate electrode;

a third gate contact which is in contact with the second gate contact, wherein the third gate contact is connected to the second upper gate electrode, and an upper surface of the third gate contact and the upper surface of the second gate contact extend along a common plane;

a first source/drain contact which extends through the upper interlayer insulating layer, the upper substrate, the junction and the lower interlayer insulating layer in the vertical direction, and is connected to the lower source/drain region; and a second source/drain contact which extends through the upper interlayer insulating layer in the vertical direction, and is connected to the upper source/drain region, wherein an upper surface of the first source/drain contact and an upper surface of the second source/drain contact extend along the common plane.

* * * * *